United States Patent
Willcock et al.

(10) Patent No.: US 9,905,276 B2
(45) Date of Patent: Feb. 27, 2018

(54) CONTROL OF SENSING COMPONENTS IN ASSOCIATION WITH PERFORMING OPERATIONS

(71) Applicant: Micron Technology, Inc., Boise, ID (US)

(72) Inventors: Jeremiah J. Willcock, Boise, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 14/977,286

(22) Filed: Dec. 21, 2015

(65) Prior Publication Data

US 2017/0178701 A1 Jun. 22, 2017

(51) Int. Cl.
- G11C 7/02 (2006.01)
- G11C 7/08 (2006.01)
- G11C 7/06 (2006.01)

(52) U.S. Cl.
CPC .............. *G11C 7/08* (2013.01); *G11C 7/062* (2013.01)

(58) Field of Classification Search
CPC .. G11C 7/065; G11C 7/08; G11C 7/06; G11C 7/062; G11C 11/4091
USPC .................................. 365/207, 205
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |

(Continued)

FOREIGN PATENT DOCUMENTS

| CN | 102141905 | 8/2011 |
|---|---|---|
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — David Lam
(74) *Attorney, Agent, or Firm* — Brooks, Cameron & Huebsch, PLLC

(57) ABSTRACT

Examples of the present disclosure provide apparatuses and methods related to performing a loop structure for operations performed in memory. An example apparatus might include an array of memory cells. An example apparatus might also include a plurality of sensing components coupled to the array and comprising a first group of sensing components coupled to a controller via a first number of control lines and a second group of sensing components coupled to the controller via a second number of control lines wherein the controller is configured to activate at least one of the first number of control lines and the second number of control lines.

29 Claims, 10 Drawing Sheets

(56) References Cited

U.S. PATENT DOCUMENTS

| | | |
|---|---|---|
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,489,588 B2 * | 2/2009 | Hanzawa ............ G11C 7/1012 365/190 |
| 7,535,769 B2 | 5/2009 | Cernea |
| 7,535,785 B2 * | 5/2009 | Kim .................. G11C 7/08 365/194 |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |

(56) References Cited

U.S. PATENT DOCUMENTS

| | | |
|---|---|---|
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Penner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0028388 A1* | 1/2016 | Kim ............... H03K 7/06 327/114 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

(56) References Cited

OTHER PUBLICATIONS

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs).

U.S. Appl. No. 13/743,686, entitled, "Weigted Search and Compare in a Memory Device," filed Jan. 17, 2013, (25 pgs).

U.S. Appl. No. 13/774,636, entitled, "Memory as a Programmable Logic Device," filed Feb. 22, 2013, (30 pgs).

U.S. Appl. No. 13/774,553, entitled, "Neural Network in a memory Device," filed Feb. 22, 2013, (63 pgs).

U.S. Appl. No. 13/796,189, entitled, "Performing Complex Arithmetic Functions in a Memory Device," filed Mar. 12, 2013, (23 pgs).

\* cited by examiner

*Fig. 2C*

CONTROL OF SENSING COMPONENTS IN ASSOCIATION WITH PERFORMING OPERATIONS

TECHNICAL FIELD

The present disclosure relates generally to semiconductor memory apparatuses and methods, and more particularly, to apparatuses and methods related to control lines provided to sensing components.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIG. 2C is a logic table illustrating selectable logic operation results implemented by sensing circuitry in accordance with a number of embodiments of the present disclosure.

DETAILED DESCRIPTION

Figure 1:
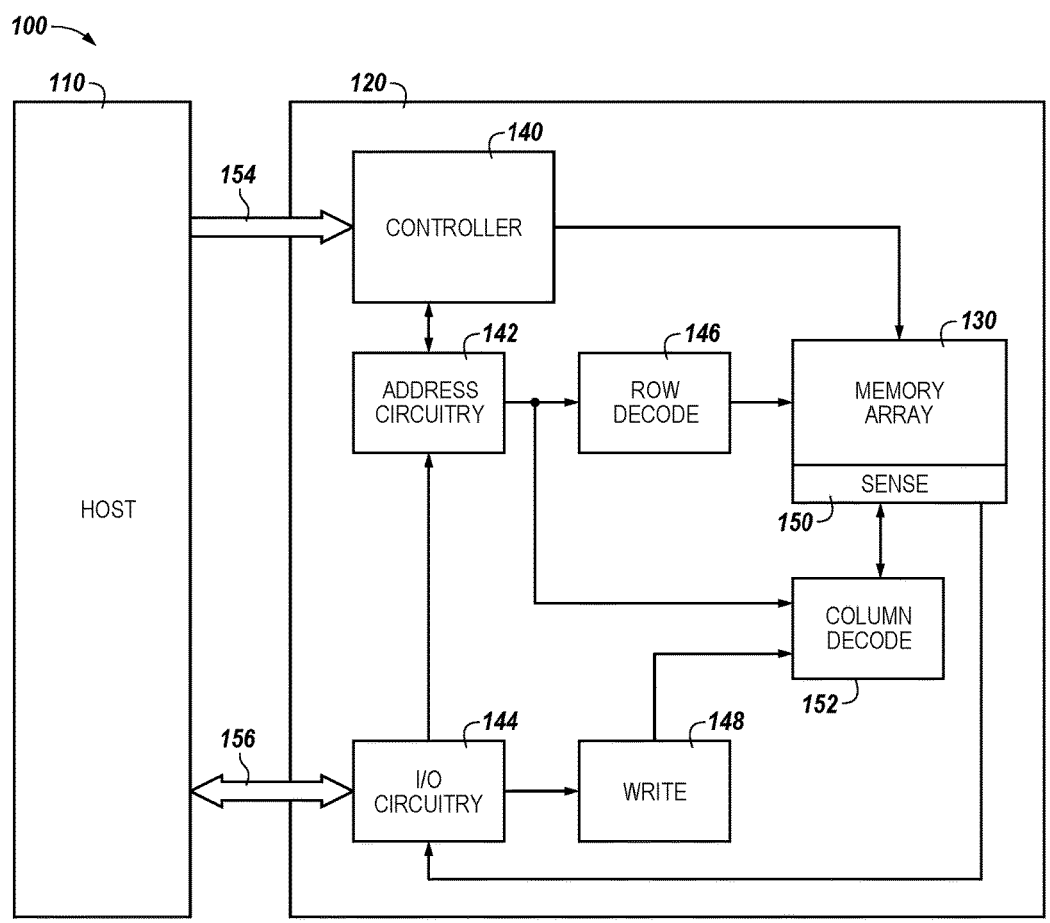
FIG. 1 is a block diagram of an apparatus in the form of a computing system including a memory device in accordance with a number of embodiments of the present disclosure.

The present disclosure includes apparatuses and methods related to coupling control lines to sensing components. A system coupling control lines to sensing components can include a plurality of sensing components coupled to an array of memory cells. The plurality of sensing components can include a first group of sensing components coupled to a controller via a first number of control lines and a second group of sensing components coupled to the controller via a second number of control lines. The controller can be configured to activate at least one of the first number of control lines and the second number of control lines.

As used herein, sensing circuitry can include a plurality of sensing components that are on pitch with a number of sense lines. Each of the sensing components can include a sense amplifier and a compute component. The control lines that couple the sensing components to the controller can allow the controller to control the sense amplifiers and/or the compute component independently from each other. That is, the controller can activate a first sense amplifier and/or a first compute component independently from the activation of a second sense amplifier and/or a second compute component.

In a number of examples, groups of sensing components can be coupled to different control lines. For example, a first group of sensing components can be coupled to a first group of control lines and a second group of sensing components can be coupled to a second group of control lines.

Providing independent control of the sensing components via separate control lines can provide various benefits, such as performing operations (e.g., logical operations) in selected groups of sensing components. For example, a first group of sensing components can perform a first operation via a first control line independently of a second group of sensing components that is coupled to a second control line. A controller can be used to selectively control which group of sensing components perform which operations via a plurality of control lines.

Examples of operations that can be performed on selected groups of sensing components include load operations, store operations, copy operations, and/or pattern operations. The operations performed in accordance with embodiments described herein can include primary operations (e.g., mathematical operations such as an addition, subtraction, multiplication, and/or division). However, embodiments of the present disclosure are not limited to a particular type of operation. A primary operation can be performed, for example, by performing a number of logical operations such as AND, OR, NOT, NAND, NOR, and XOR logical operations but are not limited to logical operations. Logical operations that are performed to perform a primary operation may be referred to herein as secondary operations.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "X," and "Y," particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 231 may reference element "31" in FIG. 2, and a similar element may be referenced as 231 in FIG. 2D. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, a memory array 130, and/or sensing circuitry 150 might also be separately considered an "apparatus."

System 100 includes a host 110 coupled to memory device 120, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines and columns coupled by sense lines (which may be referred to herein as digit lines or data lines). Although a single array 130 is shown in FIG. 1, embodiments are not so limited. For instance, memory device 120 may include a number of arrays 130 (e.g., a number of banks of DRAM cells). An example DRAM array is described in association with FIGS. 2A, 2B, and 2D.

The memory device 120 includes address circuitry 142 to latch address signals provided over an I/O bus 156 (e.g., a data bus) through I/O circuitry 144. Address signals are received and decoded by a row decoder 146 and a column decoder 152 to access the memory array 130. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

Controller 140 decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110. The controller 140 can be a state machine, a sequencer, or some other type of controller.

An example of the sensing circuitry 150 is described further below in association with FIGS. 2A to 2D. For instance, in a number of embodiments, the sensing circuitry 150 can comprise a number of sensing components each of which can comprise a sense amplifier and a compute component, each of which may comprise a latch serving as an accumulator and can be used to perform logical operations (e.g., on data associated with complementary sense lines). In a number of embodiments, the sensing circuitry (e.g., 150) can be used to perform operations using data stored in array 130 as inputs and store the results of the operations back to the array 130 without transferring data via an I/O line and/or via a sense line address access (e.g., without firing a column decode signal). As such, operations can be performed using sensing circuitry 150 rather than and/or in addition to being performed by processing resources external to the sensing circuitry 150 (e.g., by a processor associated with host 110 and/or other processing circuitry, such as ALU circuitry, located on device 120 (e.g., on controller 140 or elsewhere)).

In various previous approaches, data associated with an operation, for instance, would be read from memory via sensing circuitry and provided to an external ALU. The external ALU circuitry would perform the operations using bit-vectors (which may be referred to as operands or inputs) and the result could be transferred back to the array via the local I/O lines. In contrast, in a number of embodiments of the present disclosure, sensing circuitry (e.g., 150) is configured to selectively perform an operation on data stored in memory cells in memory array 130 and store the result back to the array 130 without activating a local I/O line coupled to the sensing circuitry.

As such, in a number of embodiments, registers and/or an ALU external to array 130 and sensing circuitry 150 may not be needed to perform the operation as the sensing circuitry 150 can be operated to perform the appropriate computations involved in performing the operation. Additionally, the operation can be performed without the use of an external processing resource.

Figure 2A:
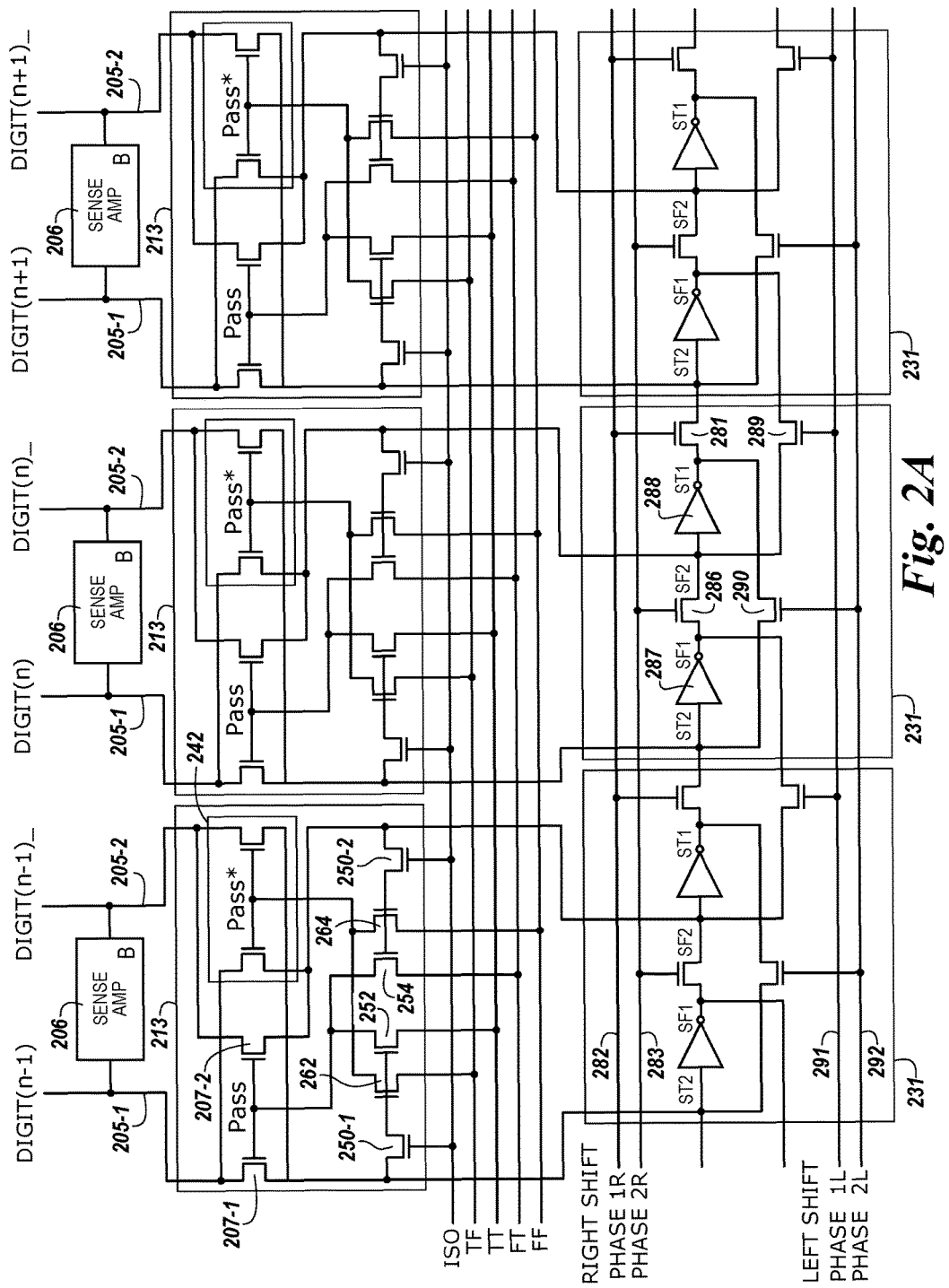
FIGS. 2A-2B are schematic diagrams illustrating sensing circuitry in accordance with a number of embodiments of the present disclosure.

FIG. 2A is a schematic diagram illustrating sensing circuitry capable of implementing a number of logical operations in accordance with a number of embodiments of the present disclosure. FIG. 2A shows a number of sense amplifiers 206 coupled to respective pairs of complementary sense lines 205-1 and 205-2, and a corresponding number of compute components 231 coupled to the sense amplifiers 206 via pass gates 207-1 and 207-2. The sense amplifiers 206 and compute components 231 shown in FIG. 2A can correspond to sensing circuitry 150 shown in FIG. 1, for example. The sensing circuitry shown in FIG. 2A includes logical operation selection logic 213, which can be operated as described further below.

Although not shown, memory cells are coupled to the pairs of complementary sense lines 205-1 and 205-2 (e.g., columns). The memory cells can be, for example, 1T1C DRAM cells each comprising a storage element (e.g., capacitor) and an access device (e.g., transistor). For example, a memory cell can comprise a transistor and a capacitor. In a number of embodiments, the memory cells may be destructive read memory cells (e.g., reading the data stored in the cell destroys the data such that the data originally stored in the cell is refreshed after being read). The cells of the memory array can be arranged in rows coupled by word lines and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pairs of complementary data lines (e.g., three columns) are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of an access transistor of a memory cell can be coupled to a data line 205-1 (D), a second source/drain region of the access transistor of the memory cell can be coupled to a capacitor of the memory cell, and a gate of the access transistor of the memory cell can be coupled to a word line of the memory array.

As shown in FIG. 2A, the sensing circuitry can comprise a sense amplifier 206, a compute component 231, and logical operation selection logic 213 corresponding to respective columns of memory cells (e.g., coupled to respective pairs of complementary data lines). The sense amplifier 206 can comprise, for example, a cross coupled latch, which can be referred to herein as a primary latch. The sense amplifiers 206 can be configured, for example, as described with respect to FIG. 2B.

In the example illustrated in FIG. 2A, the circuitry corresponding to compute components 231 is configured as a loadable shift register. For instance, each compute component 231 comprises a latch, which may be referred to herein as a secondary latch, and an additional number of transistors operable to transfer (e.g., shift) data values right and/or left (e.g., to a latch of an adjacent compute component 231). As described further herein, in a number of embodiments, the latch of the compute component 231 can serve as an accumulator. As such, the compute component 231 can operate as and/or may be referred to herein as an accumulator.

The gates of the pass gates 207-1 and 207-2 can be controlled by a logical operation selection logic signal, Pass. For example, an output of the logical operation selection logic 213 can be coupled to the gates of the pass gates 207-1 and 207-2, as shown in FIG. 2A.

The sensing circuitry shown in FIG. 2A also shows logical operation selection logic 213 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pairs of complementary sense lines 205-1 and 205-2 when the isolation transistors (e.g., 250-1 and 250-2) are enabled via the ISO control signal being asserted.

According to various embodiments, the logical operation selection logic 213 can include four logic selection transistors: logic selection transistor 262 coupled between the gates of the swap transistors 242 and a TF signal control line, logic selection transistor 252 coupled between the gates of the pass gates 207-1 and 207-2 and a TT signal control line, logic selection transistor 254 coupled between the gates of the pass gates 207-1 and 207-2 and a FT signal control line, and logic selection transistor 264 coupled between the gates of the swap transistors 242 and a FF signal control line. Gates of logic selection transistors 262 and 252 are coupled to the true sense line through isolation transistor 250-1 (having a gate coupled to an ISO signal control line). Gates of logic selection transistors 264 and 254 are coupled to the complementary sense line through isolation transistor 250-2 (also having a gate coupled to an ISO signal control line).

Data values present on the pair of complementary sense lines 205-1 and 205-2 can be loaded into the compute component 231 via the pass gates 207-1 and 207-2. When the pass gates 207-1 and 207-2 are OPEN, data values on the pair of complementary sense lines 205-1 and 205-2 are passed to the compute component 231 and thereby loaded into the loadable shift register. The data values on the pair of complementary sense lines 205-1 and 205-2 can be the data value stored in the sense amplifier 206 when the sense amplifier is enabled (e.g., fired). The logical operation selection logic signal, Pass, is activated to OPEN (e.g., turn on) the pass gates 207-1 and 207-2.

The ISO, TF, TT, FT, and FF control signals can operate to select a logical operation to implement based on the data value ("B") in the sense amplifier 206 and the data value ("A") in the compute component 231 (e.g., as used herein, the data value stored in a latch of a sense amplifier is referred to as a "B" data value, and the data value stored in a latch of a compute component is referred to as an "A" data value). In particular, the ISO, TF, TT, FT, and FF control signals are configured to select the logical operation (e.g., function) to implement independent from the data value present on the pair of complementary sense lines 205-1 and 205-2 (although the result of the implemented logical operation can be dependent on the data value present on the pair of complementary sense lines 205-1 and 205-2. That is, the ISO, TF, TT, FT, and FF control signals select the logical operation to implement directly since the data value present on the pair of complementary sense lines 205-1 and 205-2 is not passed through logic to operate the gates of the pass gates 207-1 and 207-2.

Additionally, FIG. 2A shows swap transistors 242 configured to swap the orientation of the pair of complementary sense lines 205-1 and 205-2 between the sense amplifier 206 and the compute component 231. For instance, when the swap transistors 242 are OPEN (e.g., turned on), data values on the pair of complementary sense lines 205-1 and 205-2 on the sense amplifier 206 side of the swap transistors 242 are oppositely-coupled to the pair of complementary sense lines 205-1 and 205-2 on the compute component 231 side of the swap transistors 242, and thereby loaded into the loadable shift register of the compute component 231 in a complementary manner.

As an example, the logical operation selection logic signal Pass can be activated (e.g., high) to OPEN (e.g., turn on) the pass gates 207-1 and 207-2 when the ISO control signal line is activated and either the TT control signal is activated (e.g., high) with the data value on the true sense line being "1" or the FT control signal is activated (e.g., high) with the data value on the complement sense line being "1."

The data value on the true sense line being a "1" OPENs logic selection transistors 252 and 262. The data value on the complementary sense line being a "1" OPENs logic selection transistors 254 and 264. If the ISO control signal or either the respective TT/FT control signal or the data value on the corresponding sense line (e.g., sense line to which the gate of the particular logic selection transistor is coupled) is not high, then the pass gates 207-1 and 207-2 will not be OPENed by a particular logic selection transistor.

The logical operation selection logic signal Pass* can be activated (e.g., high) to OPEN (e.g., turn on) the swap transistors 242 when the ISO control signal line is activated and either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 242 will not be OPENed by a particular logic selection transistor.

The sensing circuitry illustrated in FIG. 2A is configured to select one of a plurality of logical operations to implement directly from the four logic selection control signals (e.g., logical operation selection is not dependent on the data value present on the pair of complementary sense lines). Some combinations of the logic selection control signals can cause both the pass gates 207-1 and 207-2 and swap transistors 242 to be OPEN (e.g., conducting) at the same time, which shorts the pair of complementary sense lines 205-1 and 205-2 together. According to a number of embodiments of the present disclosure, the logical operations which can be implemented by the sensing circuitry illustrated in FIG. 2A can be the logical operations summarized in the logic tables shown in FIG. 2C.

Although not shown in FIG. 2A, each column of memory cells can be coupled to a column decode line that can be activated to transfer, via a local I/O line, a data value from a corresponding sense amplifier 206 and/or compute component 231 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry can be operated in conjunction with sense amplifiers 206 and compute components 231 to perform logical operations without transferring data to a control component external to the array, for instance. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 231 can comprise a loadable shift register. In this example, each compute component 231 is coupled to a corresponding pair of complementary data lines 205-1/205-2, with a node ST2 being coupled to the particular data line (e.g., DIGIT(n)) communicating a "true" data value and with node SF2 being coupled to the corresponding complementary data line (e.g., DIGIT(n)_) communicating the complementary data value (e.g., "false" data value).

In this example, the loadable shift register comprises a first right-shift transistor 281 of a particular compute component 231 having a gate coupled to a first right-shift control line 282 (e.g., PHASE 1R), and a second right-shift transistor 286 of the particular compute component 231 having a gate coupled to a second right-shift control line 283 (e.g., PHASE 2R). Node ST2 of the particular control component is coupled to an input of a first inverter 287, whose output (e.g., node SF1) is coupled to a first source/drain region of transistor 286. The second source/drain region of transistor 286 is coupled to the input (e.g., node SF2) of a second inverter 288. The output (e.g., node ST1) of inverter 288 is coupled to a first source/drain region of transistor 281, and a second source/drain region of transistor 281 the particular compute component 231 is coupled to an input (e.g., node ST2) of a first inverter 287 of an adjacent compute component 231. The loadable shift register shown in FIG. 2A includes a first left-shift transistor 289 coupled between node SF2 of a particular compute component and node SF1 of an adjacent compute component 231. The loadable shift register shown in FIG. 2A also includes a second left-shift transistor 290 of a particular compute component 231 having a first source/drain region coupled to node ST2 and a second source/drain region coupled to node ST1. The gate of the first left-shift transistor 289 is coupled to a first left-shift control line 291 (e.g., PHASE 1L), and the gate of the second left-shift transistor 290 is coupled to a second left-shift control line 492 (e.g., PHASE 2L).

In operation, a data value on a pair of complementary data lines (e.g., 205-1/205-2) can be loaded into a corresponding compute component 231 (e.g., by operating logical operation selection logic as described above). As an example, a data value can be loaded into a compute component 231 via overwriting of the data value currently stored in the compute component 231 with the data value stored in the corresponding sense amplifier 206. Alternatively, a data value may be loaded into a compute component by deactivating the control lines 282, 283, 291, and 292.

Once a data value is loaded into a compute component 231, the "true" data value is separated from the complement data value by the first inverter 287. Shifting data to the right (e.g., to an adjacent compute component 231) can include alternating operation of the first right-shift transistor 281 and the second right-shift transistor 286, for example, via the PHASE 1R and PHASE 2R control signals being periodic signals that go high out of phase from one another (e.g., non-overlapping alternating square waves 180 out of phase). The transistor 290 can be turned on to latch the shifted data value.

An example of shifting data left via the shift register shown in FIG. 2A can include operating control signals 291 and 292 to move a data value one control component to the left through transistors 289 and 290. Data from node ST2 is inverted through inverter 287 to node SF1. Activation of control signal 291 causes the data from node SF1 to move left through transistor 289 to node SF2 of a left-adjacent compute component 231. Data from node SF2 is inverted through inverter 288 to node ST1. Subsequent activation of control signal 292 causes the data from node ST1 to move through transistor 290 left to node ST2, which completes a left shift by one compute component 231. Data can be "bubbled" to the left by repeating the left shift sequence multiple times. Data values can be latched (and prevented from being further shifted) by maintaining the control signal 292 activated.

Embodiments of the present disclosure are not limited to the shifting capability described in association with the compute components 231. For example, a number of embodiments and include shift circuitry in addition to and/or instead of the shift circuitry described in association with a loadable shift register.

The sensing circuitry in FIG. 2A can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 206.

In a number of examples, the sense amplifier 206 and the compute component 231 can be in at least one of two states associated with the first mode and the second mode. As used herein, a state of a sense amplifier 206 and/or the compute component 231 describes a transfer of data between the sense amplifier 206 and/or the compute component 231. The state of the sense amplifier 206 and the compute component 231 can also be described as the state of a sensing component. The state of a sensing component can be based on whether the sense amplifier 206 is in an equilibration state or is storing a data value (e.g., logic "0" or logic "1"). That is, a sense amplifier can be configured to be in an initial state, wherein the initial state is one of an equilibration state and a data storage state. An equilibration state includes the sense amplifier 206 being in an equilibration state. A data storage state includes the sense amplifiers 206 storing a data value. As used herein, a data value can be referred to as a bit and/or a digit value. Data can be transferred from a compute component 231 to a sense amplifier 206 in response to enabling a pass gate (e.g., activating the PASS and/or PASS* control signals via the TF 262, TT 252, FT 254, and/or FF 264 control signals that are referred to herein as a logical operation selection logic) and the sense amplifier 206 being in a equilibration state. Data can be transferred from a sense amplifier 206 to a compute component 231 in response to enabling the pass gate (e.g., activating the PASS and/or PASS* control signals via the TF 262, TT 252, FT 254, and/or FF 264 control signals that are referred to herein as a logical operation selection logic) and the sense amplifier 206 being in a data storage state. The direction of the transfer of data between the sense amplifier 206 and the compute component 231 is determined by whether the sense amplifier 206 is in an equilibration state or stores a data value before the PASS and/or PASS* control signals are activated and by a particular operation selected via the logical operation selection logic (e.g., TF 262, TT 252, FT 254, and FF 264 control signals).

For example, if the sense amplifier 206 is equilibrated and the PASS and/or PASS* control signals are activated to provide a conduction path (e.g., electrical continuity) between the sense amplifier 206 and the compute component 231, then a data value stored in the compute component 231 can be transferred from the compute component 231 to the sense amplifier 206.

If the sense amplifier 206 is configured to store a first bit (e.g., first data value) and the PASS and/or PASS* control signals are activated to provide a conduction path between the sense amplifier 206 and the compute component 231, then a second bit (e.g., second data value) that is stored in the compute component 231 before the activation of the PASS and/or PASS* control signals can be replaced by the first bit and the sense amplifier 206 retains the first bit. Furthermore, a number of operations can be performed using the first bit and the second bit using the logical operation selection logic and the result of the operation can be stored in the compute component 231.

Using an equilibration signal to direct the transfer of data between the sense amplifier 206 and the compute component 231 can provide the ability to selectively perform an operation in sense amplifiers that are not equilibrated without performing the operation in sense amplifiers that are equilibrated. That is, a PASS and/or a PASS* control signal can be activated in a plurality of sensing components to move data between a first group of a plurality of sense amplifiers that are equilibrated and a first group of a plurality of compute components. The PASS and/or PASS* control signals can also be activated to move data between a second group of the plurality of sense amplifiers and a second group of the plurality of component components that are not equilibrated to selectively perform an operation in a second group of sense components while not performing the operation on a first group of sense components.

Figure 2B:
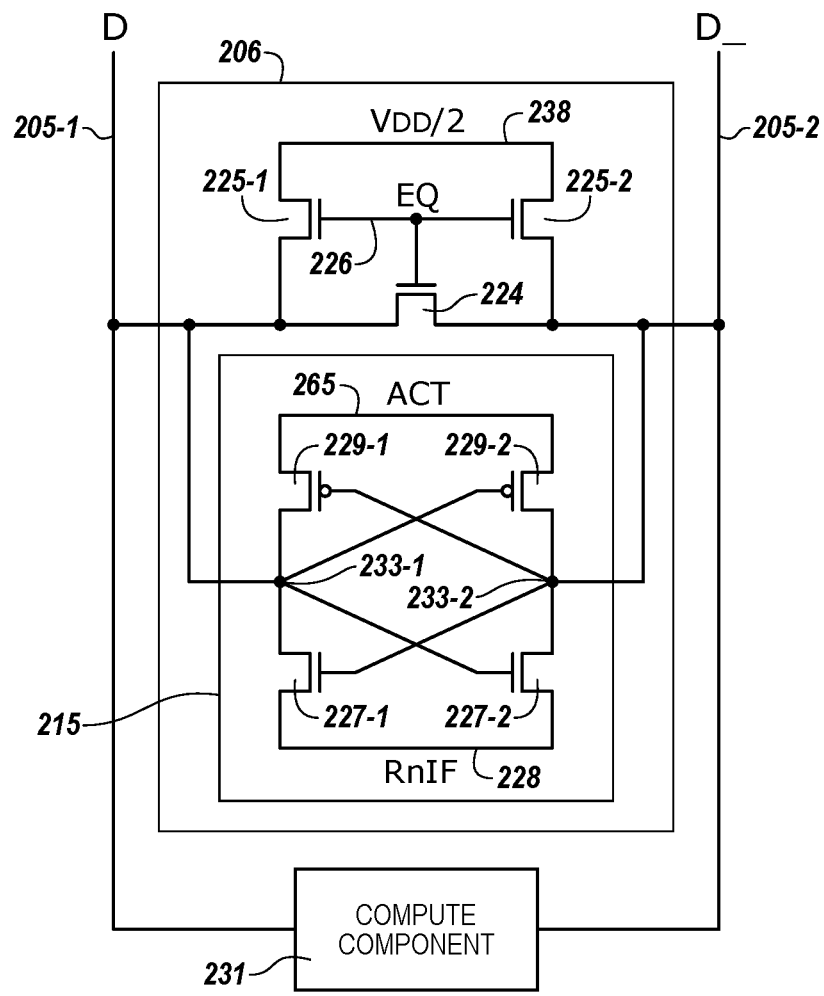

FIG. 2B illustrates a schematic diagram of a portion of sensing circuitry in accordance with a number of embodiments of the present disclosure. According to various embodiments, sense amplifier 206 can comprise a cross coupled latch. However, embodiments of the sense amplifier 206 are not limited to a cross coupled latch. As an example, the sense amplifier 206 in FIG. 2B can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 206) can comprise a number of transistors formed on pitch with the transistors of the corresponding compute component 231 and/or the memory cells of an array (e.g., 230 shown in FIG. 2A) to which they are coupled, which may conform to a particular feature size (e.g., $4F^2$, $6F^2$, etc.). Sense amplifier 206 comprises a latch 215 including four transistors coupled to a pair of complementary data lines D 205-1 and D_ 205-2. The latch 215 can be a cross coupled latch. That is, the gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231, which may be referred to herein as an accumulator, can be coupled to latch inputs 233-1 and 233-2 of the cross coupled latch 215 as shown; however, embodiments are not limited to the example shown in FIG. 2B.

In this example, a second source/drain region of transistor 227-1 and 227-2 is commonly coupled to an RnIF 228. A second source/drain region of transistors 229-1 and 229-2 is commonly coupled to an ACT signal 265. The ACT signal 265 can be a supply voltage (e.g., $V_{DD}$) and the RnIF signal can be a reference voltage (e.g., ground). Activating signals 228 and 265 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 226 (EQ). As such, activating EQ enables the transistors 224, 225-1, and 225-2, which effectively shorts data line D to data line D_ such that the data lines D and D_ are equilibrated to equilibration voltage $V_{DD}/2$. According to a number of embodiments of the present disclosure, a number of logical operations can be performed using the sense amplifier 206 and compute component 231, and the result can be stored in the sense amplifier and/or compute component.

The sensing circuitry 250-2 in FIG. 2A can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry 250-2 can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 206.

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external to the array and sensing circuitry via local I/O lines). As such, a number of embodiments of the present disclosure can enable performing various operations (e.g., logical operations, mathematical operations, etc.) using less power than various previous approaches. Additionally, since a number of embodiments eliminate the need to transfer data across I/O lines in order to perform operations (e.g., between memory and discrete processor), a number of embodiments can enable an increased parallel processing capability as compared to previous approaches.

Figure 2C:
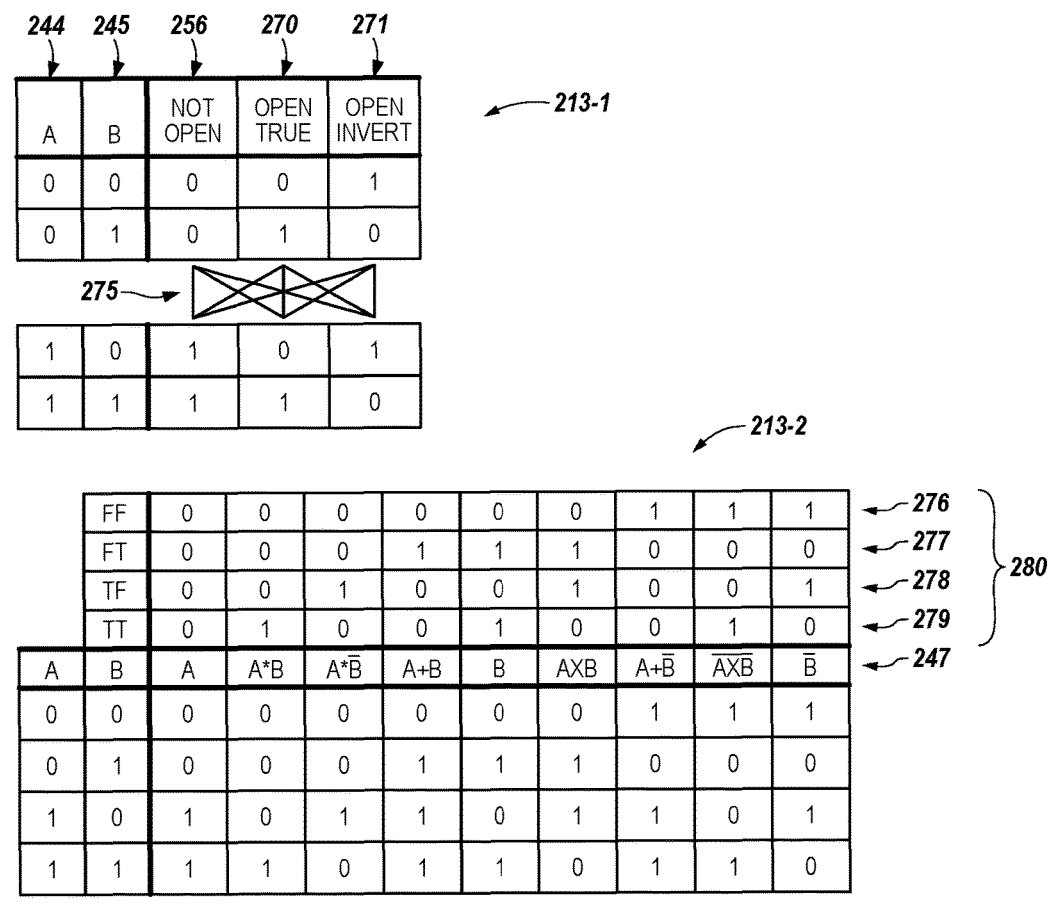

FIG. 2C is a logic table illustrating selectable logic operation results implemented by a sensing circuitry in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 206 and compute component 231. The four control signals, in conjunction with a particular data value present on the complementary sense lines, controls the state (conducting or not conducting) of the pass gates 207-1 and 207-2 and swap transistors 242, which in turn affects the data value in the compute component 231 and/or sense amplifier 206 before/after firing. The capability to selectably control the state of the swap transistors 242 facilitates implementing logical operations involving inverse data values (e.g., inverse operands and/or inverse result), among others.

Logic Table 213-1 illustrated in FIG. 2C shows the starting data value stored in the compute component 231 in FIG. 2A shown in column A at 244, and the starting data value stored in the sense amplifier 206 shown in column B at 245. The other 3 column headings in Logic Table 213-1 refer to the state of the pass gates 207-1 and 207-2, and the swap transistors 242, which can respectively be controlled to be OPEN (e.g., conducting/on) or CLOSED (e.g., not conducting/off) depending on the state of the four logic selection control signals (e.g., TF, TT, FT, and FF), in conjunction with a particular data value present on the pair of complementary sense lines 205-1 and 205-2 when the ISO control signal is asserted. The "Not Open" column corresponds to the pass gates 207-1 and 207-2 and the swap transistors 242 both being in a non-conducting condition, the "Open True" corresponds to the pass gates 207-1 and 207-2 being in a conducting condition, and the "Open Invert" corresponds to the swap transistors 242 being in a conducting condition. The configuration corresponding to the pass gates 207-1 and 207-2 and the swap transistors 242 both being in a conducting condition is not reflected in Logic Table 213-1 since this results in the sense lines being shorted together.

The logic tables illustrated in FIG. 2C reflect a result initially stored in the compute component 231 in FIG. 2A. Therefore, when the pass gates 207-1 and 207-2 are controlled to be CLOSED (e.g., not conducting), the result initially stored in the compute component 231 is the same as the starting data value in the compute component 231. However, since the sense sensing circuitry 250 is configured such that the sense amplifier 206 can overpower the compute component 231 as shown in the "Not Open" column 256 of the Logic Table 213-1, the result initially stored in the compute component 231 is the same as the starting data value in the sense amplifier 206 when the pass gates 207-1 and 207-2 are controlled to be OPEN (e.g., conducting) as shown in the "Open True" column 270 of the Logic Table 213-1. The compute component 231 can be inverted as shown in the "Open Invert" column 271 when the swap transistors 242 are in a conducting condition.

Via selective control of the state of the pass gates 207-1 and 207-2 and the swap transistors 242, each of the three columns of the upper portion of Logic Table 213-1 can be combined with each of the three columns of the lower portion of Logic Table 213-1 to provide 3×3=9 different result combinations, corresponding to nine different logical operations, as indicated by the various connecting paths shown at 275. The nine different selectable logical operations that can be implemented by the sensing circuitry 250 are summarized in Logic Table 213-2 illustrated in FIG. 2C.

The columns of Logic Table 213-2 illustrated in FIG. 2C show a heading 280 that includes the state of logic selection control signals. For example, the state of a first logic selection control signal is provided in row 276, the state of a second logic selection control signal is provided in row 277, the state of a third logic selection control signal is provided in row 278, and the state of a fourth logic selection control signal is provided in row 279. The particular logical operation corresponding to the results is summarized in row 247.

For example, the results for the values of FF, FT, TF, and TT of "0000" are summarized as "A" since the result (initially stored in the compute component after the sense amplifier fires) is the same as the starting value in the compute component. Other columns of results are similarly annotated in row 247, where "A*B" intends A AND B, "A+B" intends A OR B, and "AXB" intends A XOR B. By convention, a bar over a data value or a logical operation indicates an inverted value of the quantity shown under the bar. For example, AXB bar intends not A XOR B, which is also A XNOR B.

Figure 2D:
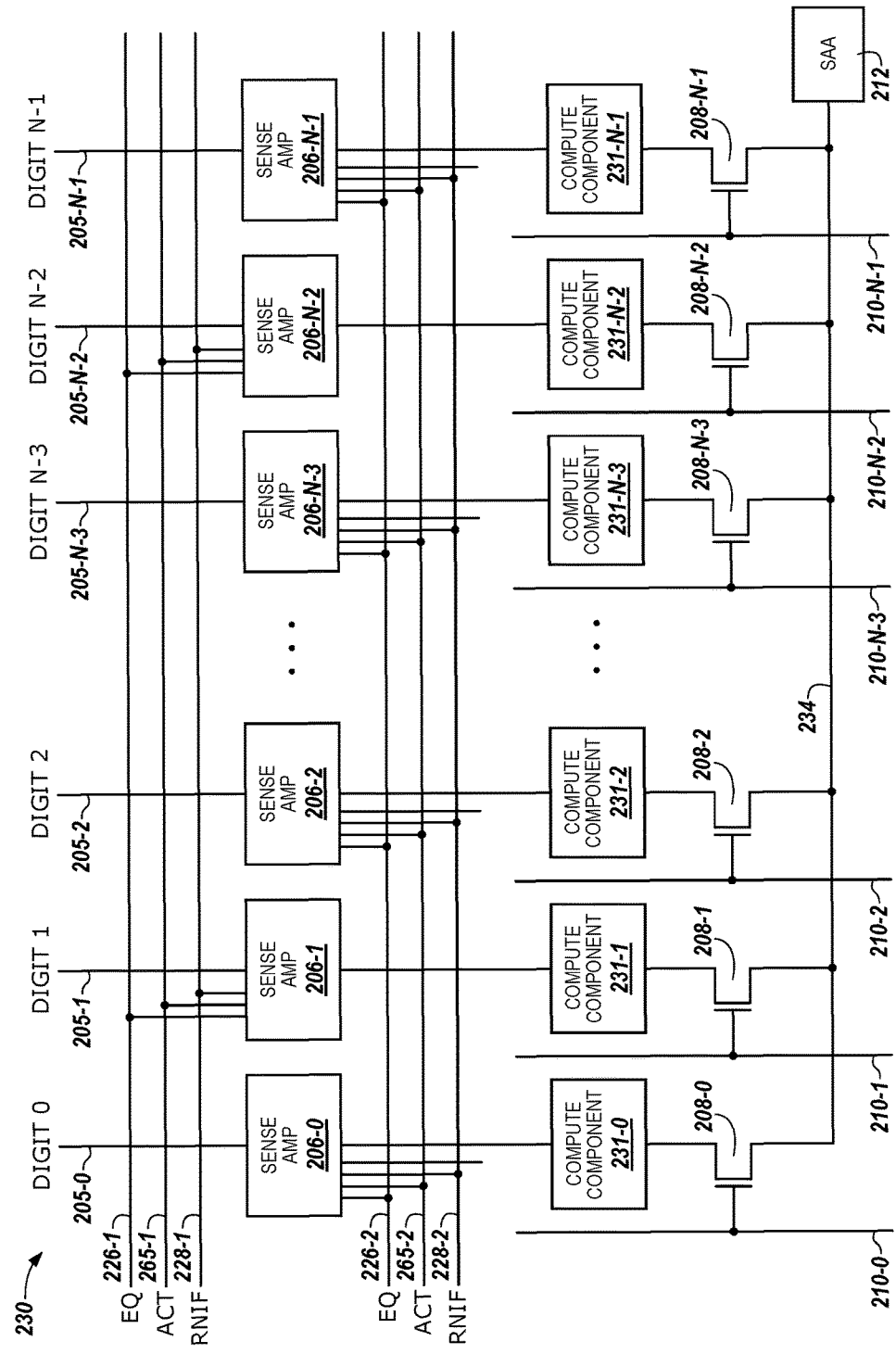
FIG. 2D is a schematic diagram illustrating sensing circuitry in accordance with a number of embodiments of the present disclosure.

FIG. 2D is a schematic diagram illustrating sensing circuitry in accordance with a number of embodiments of the present disclosure. The array 230 includes memory cells coupled to rows of access lines and columns of sense lines 205-0, 205-1, 205-2, . . . , 205-(N−1) (referred to generally as 205). Memory array 230 is not limited to a particular number of access lines and/or sense lines, and use of the terms "rows" and "columns" does not intend a particular physical structure and/or orientation of the access lines and/or sense lines. Although not shown, each column of memory cells can be associated with a corresponding pair of complementary sense lines (e.g., complementary sense lines 205-1 and 205-2 in FIG. 2A).

Each column of memory cells can be coupled to sensing circuitry (e.g., sensing circuitry 150 shown in FIG. 1). In this example, the sensing circuitry comprises a number of sensing components. Each of the number of sensing components comprises a sense amplifier (referred to generally as sense amplifier 206) and a compute component (referred to generally as compute component 231). In FIG. 2D, array 230 includes sense amplifiers 206-0 to 206-(N−1) and corresponding compute components 231-0 to 231-(N−1).

The number of sense amplifiers 206 are coupled to the respective sense lines 205. The sense amplifiers 206 are coupled to input/output (I/O) line 234 (e.g., a local I/O line) via corresponding transistors 208-0, 208-1, 208-2, . . . , 208-(N−1). In this example, the sensing circuitry also comprises a number of compute components 231 coupled to the respective sense lines 205. Column decode lines 210-0 to 210-(N−1) are coupled to the gates of transistors 208-0 to 208-(N−1), respectively, and can be selectively activated to transfer data sensed by respective sense amplifiers 206-0 to 206-(N−1) and/or stored in respective compute components 231-0 to 231-(N−1) to a secondary sense amplifier 212. In a number of embodiments, the compute components 231 can be formed on pitch with the memory cells of their corresponding columns and/or with the corresponding sense amplifiers 206.

In a number of examples, the sensing components can be divided into a plurality of groups and each of the plurality of groups can be coupled to a plurality of different control lines (e.g., control lines that couple the plurality of groups of the sensing components to a controller such as controller 140 shown in FIG. 1). In FIG. 2D, the sensing components are divided into two groups. However, the sensing components can be divided into three or more groups. In this example, a first group of sensing components comprises those sensing components corresponding to odd numbered columns (e.g., sense amplifiers 206-1, . . . , 206-(N−3), and 206-(N−1) and corresponding compute components 231-1, . . . , 231-(N−3), and 231-(N−1)), and a second group of sensing components comprises those sensing components corresponding to even numbered columns (e.g., sense amplifier 206-0, 206-2, . . . , 206-(N−4), and 206-(N−2) and corresponding compute components 231-0, 231-2, . . . , 231-(N−4), 231-(N−2)).

In FIG. 2D, each particular group of sensing components does not comprise consecutive sensing components. That is, the sensing components of first and second groups are interleaved such that the sensing components of a particular group are not physically adjacent to each other. In this example, each sensing component from the first group of sensing components is physically next to a sensing component from the second group of sensing components. In a number of examples, the sensing components can be grouped such that each particular group comprises a number of consecutive sensing components. Groups of sensing components that are divided into a number of groups of consecutive sensing components can be referred to as "blocks" of sensing components.

In a number of examples, an array can comprise 16,384 columns (e.g., 16,384 sense lines 205, or pairs of complementary sense lines). That is, N can be equal to 16,384. As such, there can be 16,384 sensing components each including one of 16,384 sense amplifiers 206 and a corresponding one of 16,384 compute components 231. While in FIG. 2D the sensing components are divided into two groups, embodiments are not limited to a particular number of groups of sensing components. For example, the sensing components can be divided into more than two groups (e.g., four groups, five groups, eight groups, etc.).

Each of the groups of sensing components can be coupled to a different number of control lines. For example, the first group of sensing components is coupled to control lines 226-1, 264-1, and 228-1. The second group of sensing components is coupled to control lines 226-2, 265-2, and 228-2. Control lines 226-1 and 226-2 are equilibration (EQ) control lines. Control lines 264-1 and 264-2 are active positive (ACT) control lines. Control lines 228-1 and 228-2 are active negative (RnIF) control lines.

In an example in which the sensing components are divided into eight groups, eight groups of control lines could be provided to the eight respective groups from a controller (e.g., controller 140 shown in FIG. 1), and each of the eight groups of control lines can include separate EQ control lines, an ACT control lines, and/or RnIF control lines.

A controller (e.g., 140) can utilize the control lines 226-1, 226-2, 264-1, 264-2, 228-1, and 228-2 to selectively perform operations using the sensing components by activating a first plurality of control lines 226-1, 264-1, and 228-1 independently from the second plurality of control lines 226-2, 264-2, and 228-1. The first plurality of control lines 226-1, 264-1, and 228-1 can be independent from the second plurality of control lines 226-2, 264-2, and 228-1 via a physical separation. That is, the first plurality of control lines 226-1, 264-1, and 228-1 can couple a first group of sensing components to a controller without coupling a second group of sensing components to the controller. The second plurality of control lines 226-2, 264-2, and 228-2 can couple the second group of sensing components to the controller without coupling the first group of sensing components to the controller.

As used herein, the term selectively is used to denote that various options may be available from which to choose. For example, selectively performing an operation can include performing operations on a first group of sensing components and while not performing the operation on a second group of sensing components.

For example, a controller (e.g., 140) can activate the control lines 226-1 to equilibrate the first group of sensing components without equilibrating the second group of sensing components (e.g., such that the sense amplifiers of the first group of sensing components are in an equilibrated state while the sense amplifiers corresponding to the second group of sensing components remain in a non-equilibrated state). The control line 226-2 can be activated to equilibrate the second group of sensing components without equilibrating the first group of sensing components. The control lines 226-1, 264-1, and 228-1 can also be activated to perform an operation on the first group of sensing components without performing the operation on the second group of sensing components. The control lines 226-2, 264-2, and 228-2 can be activated to perform an operation in the second group of sensing components without performing the operation in the first group of sensing components.

At least one of the control lines 226-1, 226-2, 264-1, 264-2, 228-1, and 228-2 can be activated to selectively provide the control signals to the groups of sensing components. Each of the groups of sensing components can be configured to receive the number of control signals via the control lines 226-1, 226-2, 264-1, 264-2, 228-1, and/or 228-2. For example, the EQ control lines 226-1 and 226-2 can be activate to provide an EQ signal, the ACT control lines 264-1 and 264-2 can be activated to provide an ACT signal, and/or the RnIF control lines 228-1 and 228-2 can be activated to provide an RnIF control signal.

In a number of examples, a plurality of sensing components can correspond to a respective plurality of columns of an array. The plurality of sensing components can be configured to receive a control signal from the controller. The controller can be configured to selectively provide the control signal to the plurality of sensing components. Each of the plurality of sensing components can be configured to receive a number of control signals. The plurality of sensing components can comprise a first group of sensing components coupled to the controller via the first number of control lines and a second group of sensing components coupled to the controller via a second number of control lines. The controller can be configured to selectively activate at least one of the first number of control lines and the second number of control lines.

Figure 3A:
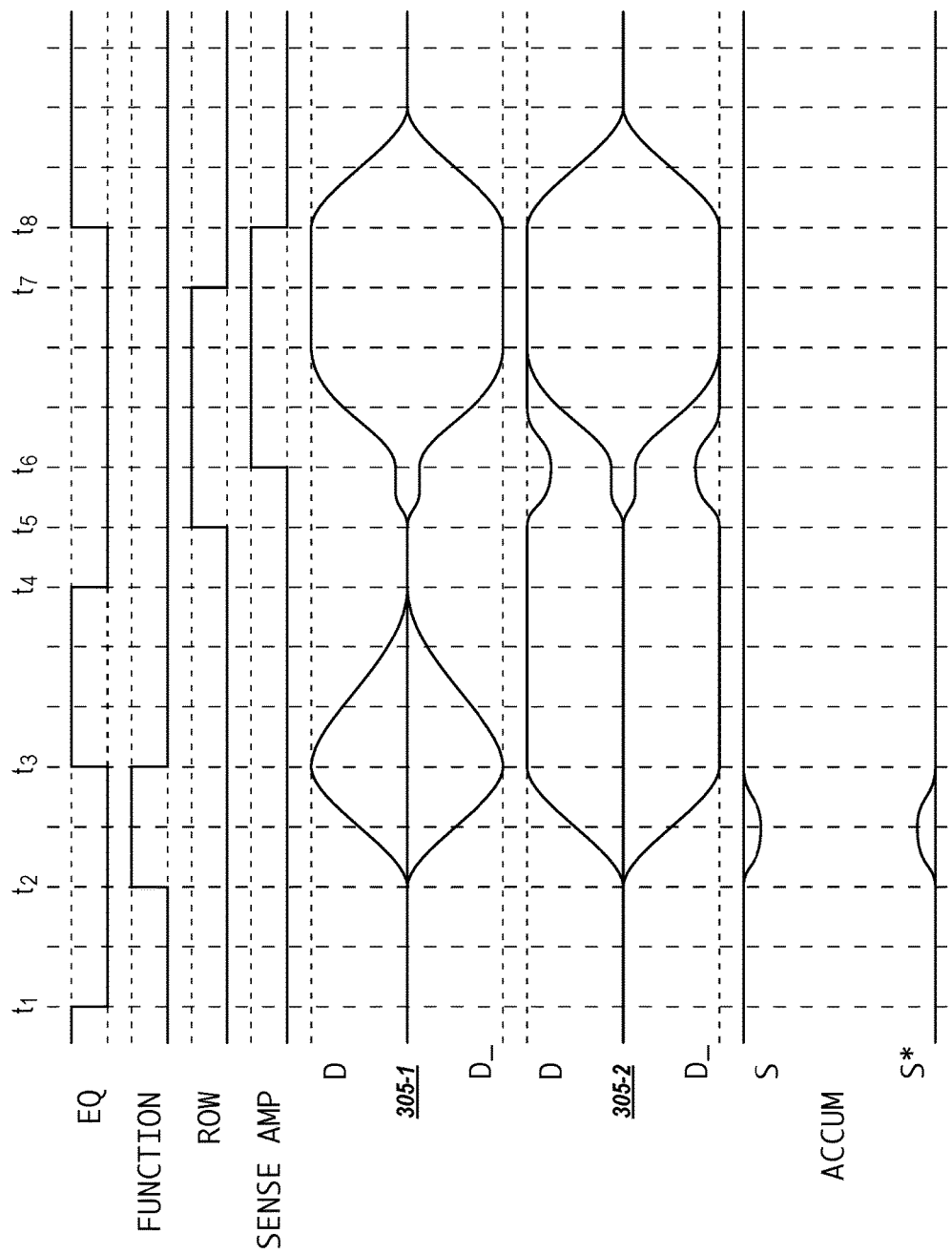
FIG. 3A-3E are timing diagrams illustrating operation of sensing circuitry in accordance with a number of embodiments of the present disclosure.
Figure 3B:
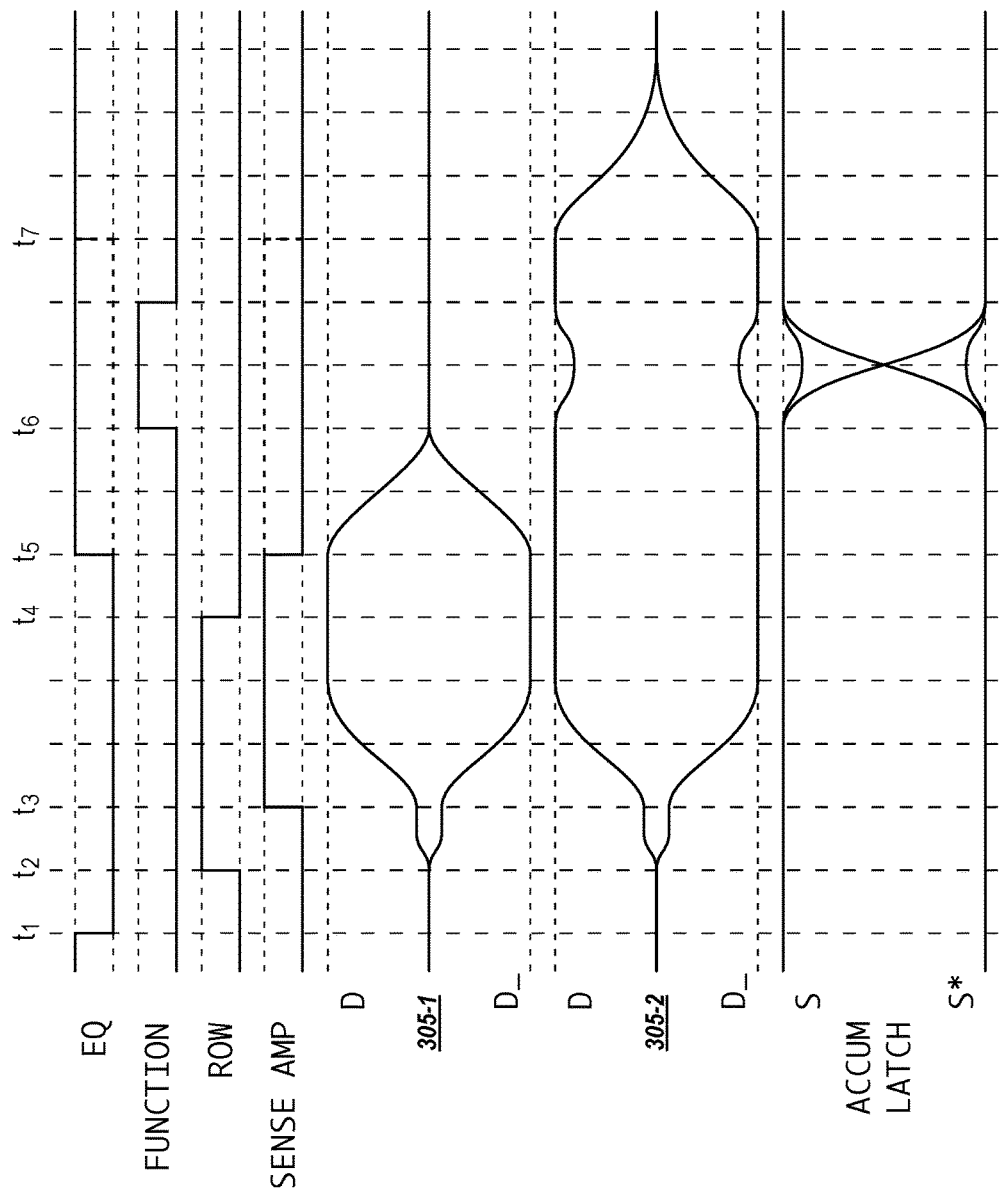
Figure 3C:
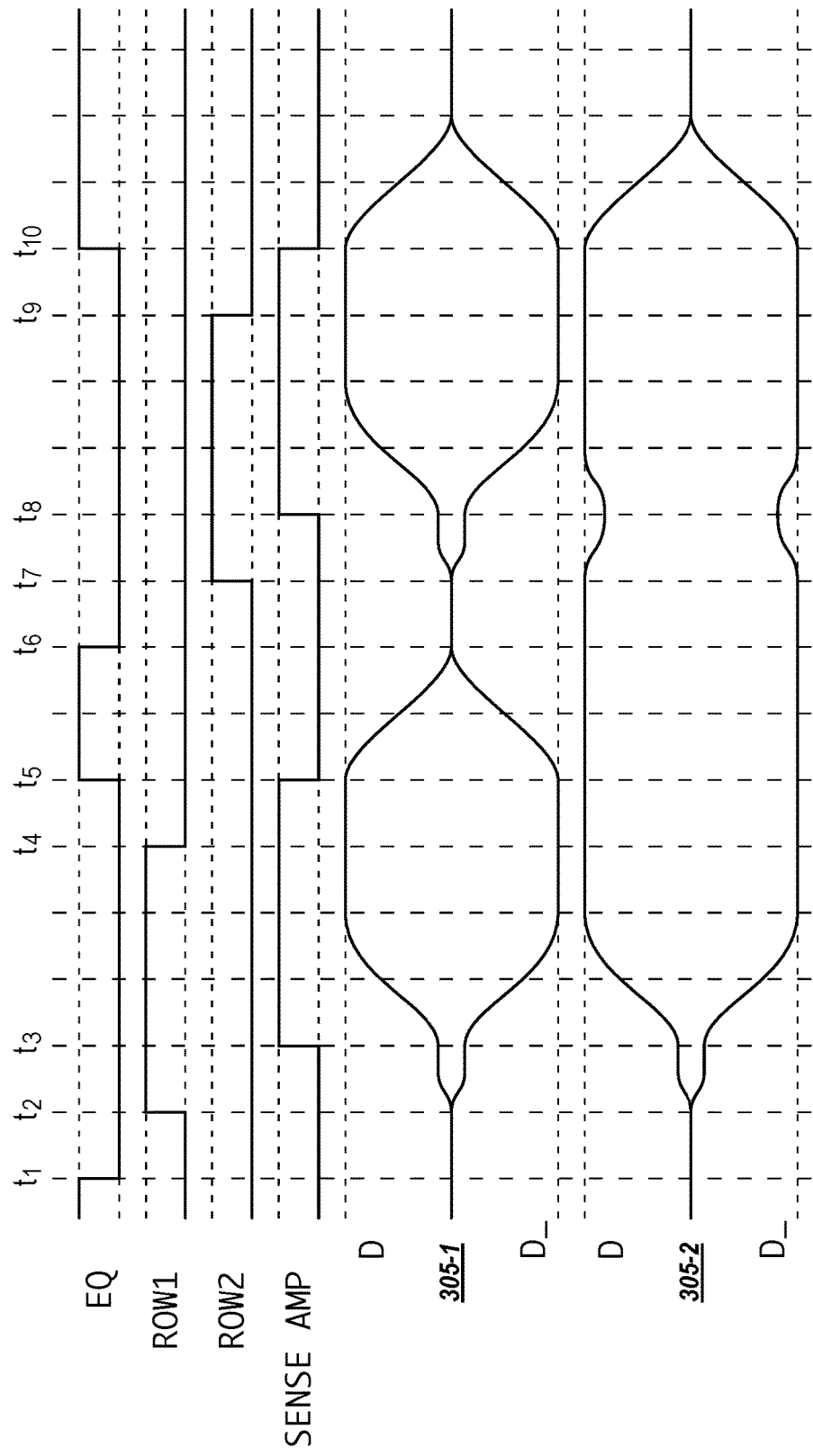
Figure 3D:
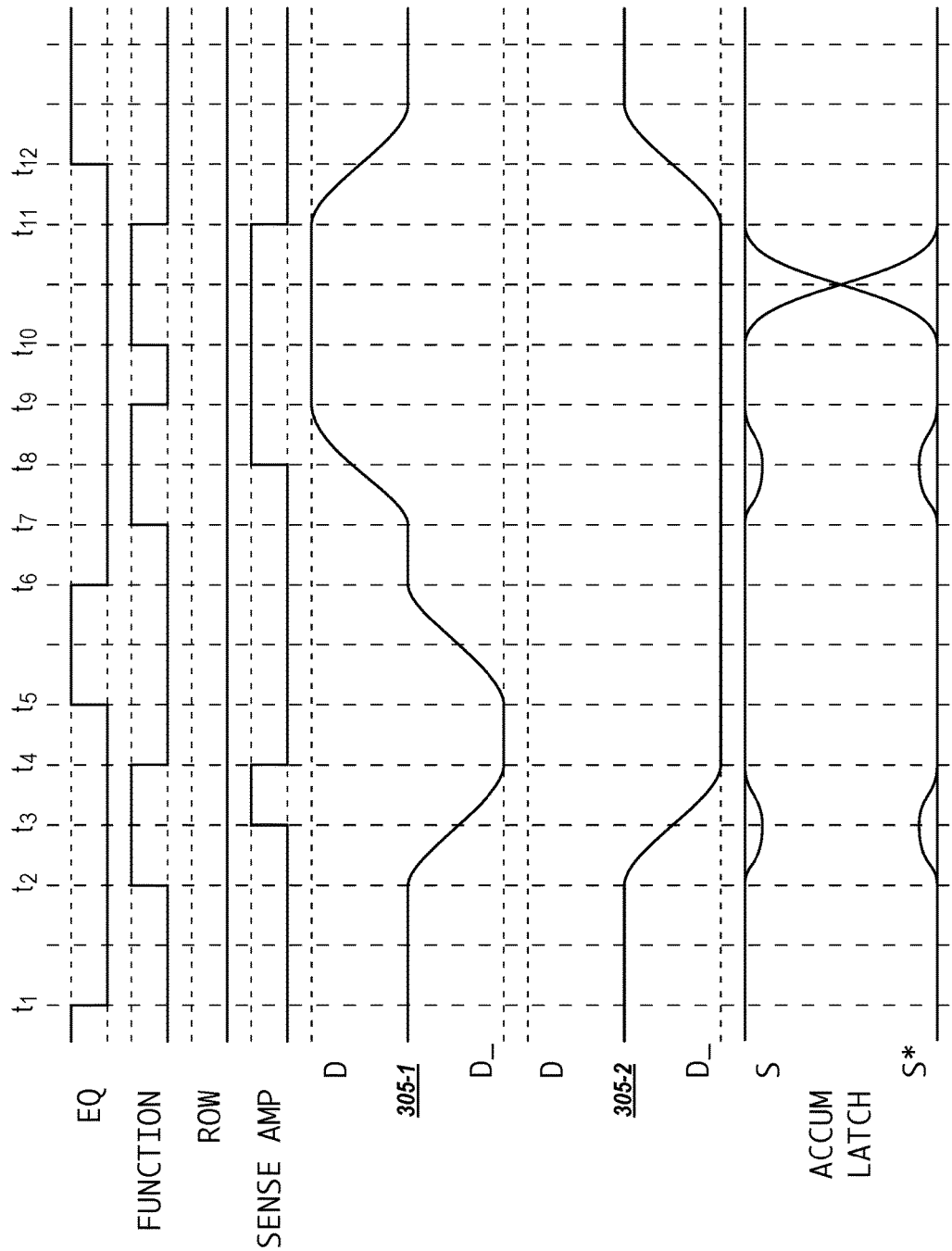

FIGS. 3A to 3E include examples of selectively performing operations. For example, FIG. 3A provides an example of selectively modifying memory cells coupled to an access line (e.g., a row of cells) using data stored in a plurality of compute components. That is, FIG. 3A provides an example of selectively storing data in memory cells coupled to a particular row. FIG. 3B provides an example of selectively modifying a plurality of compute components using data stored in memory cells coupled to a row. That is, FIG. 3B provides an example of selectively loading data into a plurality of compute components. FIG. 3C provides an example of selectively copying data from memory cells coupled to a first row to memory cells coupled to a second row. FIG. 3D provides an example of selectively generating patterns of zeros and ones.

Figure 3E:
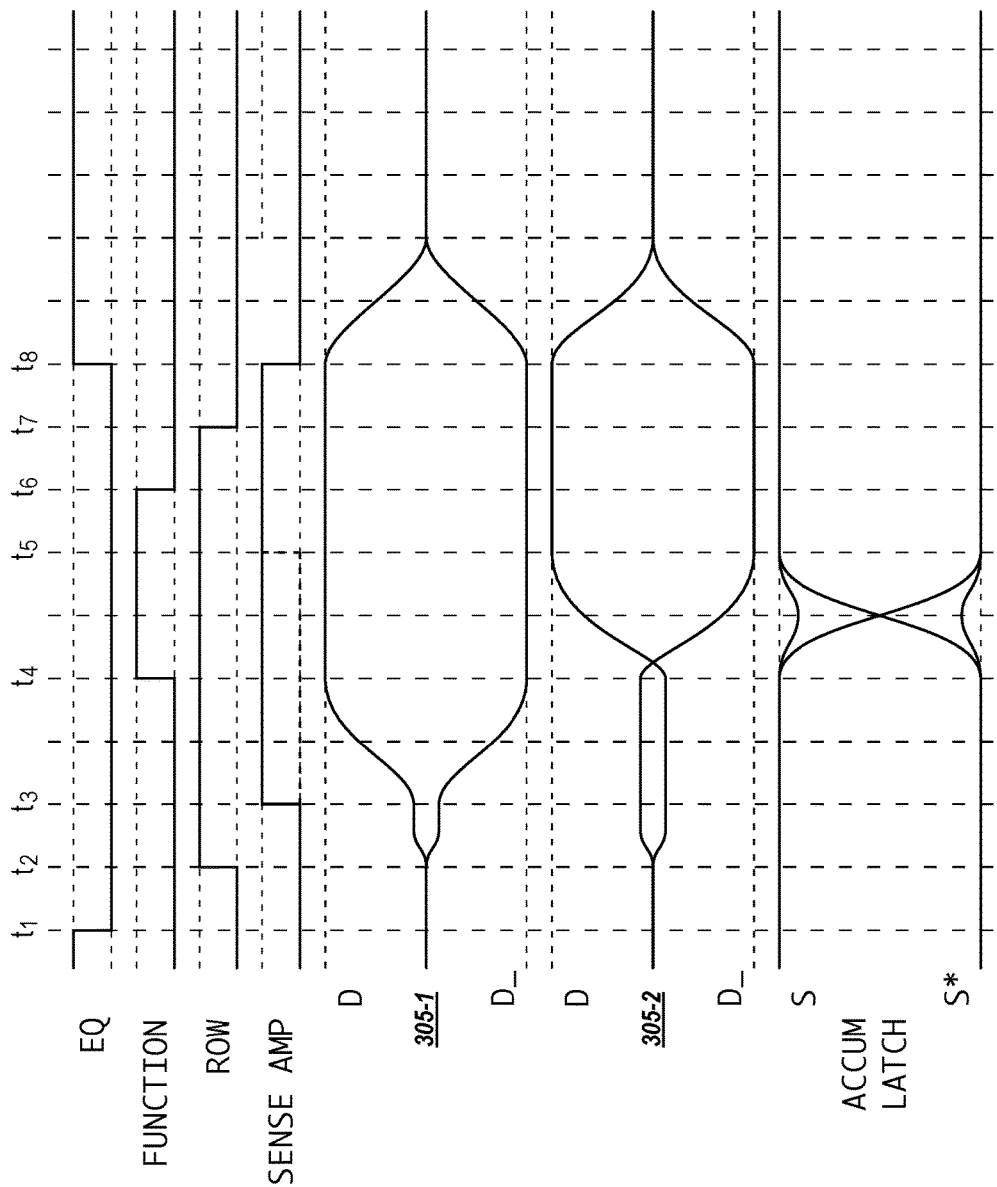

In a number of examples, the sense amplifiers can be selectively activated to selectively perform an operation. That is, a first group of the sense amplifiers can be activated while a second group of the sense amplifiers is not activated to move data between a plurality of compute components and the first group of the sense amplifiers and the second group of the sense amplifiers. The sense amplifiers are activated by enabling an ACT signal 265 and RnIF signal 228 as shown in FIG. 2C. Activating a sense amplifier includes deactivating an equilibration signal (e.g., EQ) such that a data value is stored (e.g., latched) in the sense amplifier. FIG. 3E provides an example of selectively storing data in memory cells coupled to a row and updating a plurality of compute components with the stored data by selectively activating sense amplifiers.

FIG. 3A is a timing diagram illustrating operation of the sensing circuitry in accordance with a number of embodiments of the present disclosure. FIG. 3A provides an example of selectively modifying memory cells coupled to a row using data stored in a plurality of compute components. As used herein, modifying a memory cell refers to overwriting a data value (e.g., bit) stored in the memory cell. The example shown in FIG. 3A involves a plurality of memory cells that are coupled to a particular access line (e.g., row). Selectively modifying the plurality of memory cells includes not modifying data stored in a first number of groups of the plurality of memory cells and modifying data stored in a second number of groups of the plurality of memory cells. For example, memory cells can be modified in three groups of memory cells and remain unmodified in three other groups of memory cells.

In FIG. 3A, there are two groups of memory cells. A first group of memory cells is not modified and a second group of memory cells is modified. The first group of memory cells is coupled to a first plurality of sense lines. The first plurality of sense lines are coupled to a first group of sensing components comprising sense amplifiers and compute components. The second group of memory cells is coupled to a second plurality of sense lines. The second plurality of sense lines is coupled to a second group of sensing components comprising sense amplifiers and compute components.

FIG. 3A illustrates a number of control signals associated with operating sensing circuitry (e.g., 250-2 in FIG. 2A). "EQ" corresponds to an equilibrate signal applied to the sense amplifier 206-2 (e.g., via an equilibrate control line), "FUNCTION" corresponds to signals applied to PASS and/or PASS* gates that are controlled by a logical operation selection logic including the TF, TT, FT, and FF control signals, "ROW" corresponds to an activation signal applied to an access line, "SENSE AMP" corresponds to activation signal applied to a sense amplifier. The TF, TT, FT, and FF control signals can be provided to the sense components via a number of function lines.

FIG. 3A also illustrates the waveform diagrams showing the signals (e.g., voltage signals) on a first group of digit lines D and D_ (e.g., 305-1) coupled to a first group of sense amplifiers and on a second group of digit lines D and D_ (e.g., 305-2) coupled to a second group of sense amplifiers. FIG. 3A also illustrates the waveform diagrams showing the signals (e.g., voltage signals) on the nodes S and S* corresponding to the compute component (e.g., accumulator) during the selective store operation. The particular timing diagram waveforms are discussed below with respect to the pseudo code associated with selectively storing data in memory cells.

An example of pseudo code associated with selectively storing data in memory cells can be summarized as follows:

Deactivate EQ;
Applying function lines;
Trigger EQ signal except where operation is desired;
Open Row and Fire Sense Amplifiers;
Close Row;
Equilibrate;

In the pseudo code above, "Deactivate EQ" indicates that an equilibration signal (EQ signal shown in FIG. 3A) corresponding to a first group of sense amplifiers and a second group of sense amplifiers is disabled at $t_1$ as shown in FIG. 3A. As such, at $t_1$ the voltage on the complementary data lines 305-1 and 305-2 (e.g., D and D_) is $V_{DD}/2$. "Apply function lines" as shown in the above pseudocode can refer to activating appropriate control signals (e.g., TF, TT, FT, and FF shown in FIG. 2D) coupled to the sense amplifiers corresponding to the first group of sense amplifiers and the second group of sense amplifiers to perform a selected operation (e.g., as described above in FIGS. 2A and 2C). As shown in FIG. 3A, at $t_2$ the Function signal is activated indicating activation of appropriate control signals corresponding to a selected operation.

S and S* are shown to indicate data values present in the compute components. Data values (e.g., bits) stored in the plurality of compute components corresponding to first and second groups of sense amplifiers can be transferred from the plurality of compute components to the first sense amplifiers and the second sense amplifiers responsive to the equilibration state of the sense amplifiers. For instance, if a sense amplifier is equilibrated during activation of the function lines, then data is transferred from a compute component to the corresponding sense amplifier. If a sense amplifier is not equilibrated during activation of the function lines, then the data value stored in the sense amplifier is transferred from the sense amplifier to the corresponding compute component. As such, the first group of sense amplifiers and the second group of second sense amplifiers can store a copy of the data stored in the plurality of corresponding compute components subsequent to activation of the function lines.

FIG. 3A shows data as being present on the complementary data lines 305-1 and 305-2 at $t_3$. A voltage corresponding to a logic 1 (e.g., $V_{DD}$) or a voltage corresponding to a logic 0 (e.g., GND) is shown as being on data line 305-1 (D) and data line 305-2 (D). The voltage corresponding to the complementary logic value is placed on the complementary data line 305-1 (D_) and complementary data line 305-2 (D_). Data is shown as being present on the complementary data lines 305-1 because data is transferred from the compute components to the first group of sense amplifiers. Data is shown as being present on the complementary data lines 305-2 because data is transferred from the compute components to the second group of sense amplifiers.

In the pseudo code above, "Trigger EQ signal except where operation is desired" indicates that the equilibration signal (EQ signal shown in FIG. 3A) corresponding to the first group of sense amplifiers is enabled at $t_3$ as shown in FIG. 3A. Therefore, the complementary data lines 305-1 (D and D_) associated with the first group of sense amplifiers are shorted to $V_{DD}/2$ and complementary data lines 305-2 (D and D_) associated with the second group of sense amplifiers are not shorted to $V_{DD}/2$ at $t_4$. In FIG. 3A, the EQ signal is shown as a solid line between $t_3$ and $t_4$ indicating equilibration of the first group of sense amplifiers, while the EQ signal is shown as a dotted line between $t_3$ and $t_4$ indicating non-equilibration of the second group of sense amplifiers. That is, between $t_3$ and $t_4$, the first group of sense amplifiers is equilibrated and the second group of sense amplifiers is not equilibrated. Independently controlling equilibration of different groups of sense amplifiers can provide various benefits as described further herein.

In the example described in association with FIG. 3A, the data values that were previously stored in the first group of sense amplifiers are lost upon the equilibration of the first group of sense amplifiers, while the data values previously stored in the second group of sense amplifiers are retained (e.g., because the second group of sense amplifiers are not equilibrated at $t_3$).

After equilibration of the first group of sense amplifiers is disabled at $t_4$ as shown in FIG. 3A, a selected row to which the plurality of memory cells are coupled is enabled (e.g., by activating a "Row" signal provided to a selected row) as indicated by "Open Row" in the pseudo code and shown at $t_5$ in FIG. 3A. When the Row signal reaches the threshold voltage (Vt) of the access transistors (e.g., 202-4) corresponding to the cells of the selected row, the access transistors turn on and a differential voltage signal is created between the complementary data line pairs (e.g., D/D_) based on the voltage stored on the capacitors (e.g., 203-4).

In the pseudo code above, "Fire Sense Amplifiers" indicates that the first group of sense amplifiers and the second group of sense amplifiers are activated (e.g., fired) and subsequently deactivated. For example, activating the sense amplifiers can include the ACT positive control signal (e.g., 265 shown in FIG. 2C) going high while the RnIF negative control signal (e.g., 228 shown in FIG. 2C) goes low, which amplifies the differential signal between complementary data lines 305-1 and 305-2, resulting in data values being "latched" by the sense amplifiers.

Activating the sense amplifiers while the selected row is enabled results in data being moved via complementary data lines from the second group of sense amplifiers to the second group of memory cells. That is, the second group of memory cells that are coupled to sense lines that are also coupled to the second group of sense amplifiers store a copy of the data stored in the second group of sense amplifiers. Activating the first group of sense amplifiers while the selected row is enabled results in the data being moved from the first group of memory cells to the first group of sense amplifiers. That is, the data stored in the first group of memory cells that are coupled to sense lines that are also coupled to the first group of sense amplifiers is latched in the sense amplifiers. The data is latched in the first group of sense amplifiers because the first group of sense amplifiers were equilibrated before the first group of sense amplifiers was activated. As such, data from the compute components can be selectively stored in the memory cells coupled to the selected row by moving data from the compute components to the corresponding first group of sense amplifiers and to the corresponding second group of sense amplifiers, by moving data from the second group of sense amplifiers to the second group of memory cells, and by not moving data from the first group of sense amplifiers to the second group of memory cells.

After the sense amplifiers are activated, the Row signal applied to the selected row is disabled as indicated by "Close Row" in the pseudo code above and as shown at $t_7$ in FIG. 3A, which can be accomplished by the access transistor turning off to decouple the selected cells from the corresponding data line. Once the selected row is closed and the memory cells are isolated from the data lines, the data lines can be precharged as indicated by the "Equilibrate" in the pseudo code above and as shown at $t_8$ in FIG. 3A (e.g., equilibration is performed on the first and second groups of sense amplifiers as shown at $t_8$). A precharge of the data lines can be accomplished by an equilibrate operation, as described above.

FIG. 3B is a timing diagram illustrating operation of the sensing circuitry in accordance with a number of embodiments of the present disclosure. FIG. 3B provides an example of selectively modifying a plurality of compute components using data stored in memory cells coupled to a particular row. That is, FIG. 3B provides a number of waveforms and control signals associated with an example of selectively loading data into a plurality of compute components. Selectively modifying the plurality of compute components can include modifying data stored in a first group of compute components while maintaining data stored in a second (e.g., different) group of compute components in an unmodified state.

Although the example shown in FIG. 3B involves two groups of compute components, embodiments are not limited to two groups of compute components and can include more groups of compute components. The first group of compute components corresponds to a first group of columns (e.g., coupled to a first plurality of sense lines or complementary sense line pairs). The first group of compute components is coupled to a corresponding first group of sense amplifiers. The second group of compute components corresponds to a second group of columns (e.g., coupled to a second plurality of sense lines or complementary sense line pairs) and are coupled to a corresponding second group of sense amplifiers.

FIG. 3B illustrates a number of control signals associated with operating sensing circuitry (e.g., 250-2 in FIG. 2A). "EQ" corresponds to an equilibrate signal applied to the sense amplifier 206-2, "FUNCTION" corresponds to signals applied to PASS and/or PASS* gates that are controlled by a logical operation selection logic including the TF, TT, FT, and FF control signals, "ROW" corresponds to an activation signal applied to a selected access line, and "SENSE AMP" corresponds to an activation signal applied to a sense amplifier.

FIG. 3B also illustrates the waveform diagrams showing the signals (e.g., voltage signals) on a first group of data lines D and D_ (e.g., 305-1) coupled to a first group of sense amplifier and on a second group of data lines D and D_ (e.g., 305-2) coupled to a second group of sense amplifiers. FIG. 3B also illustrates the waveform diagrams showing the signals (e.g., voltage signals) on the nodes S and S* corresponding to the compute component (e.g., accumulator) during the selective store operation. The particular timing diagram waveforms are discussed below with respect to the pseudo code associated with selectively storing data in memory cells.

An example of pseudo code associated with selectively loading data in the compute components can be summarized as follows:
Deactivate EQ;
Open Row;
Fire Sense Amplifiers;
Trigger EQ signal except where operation is desired;
Apply Function Lines;
Equilibrate In the pseudo code above, "Deactivate EQ" indicates that an equilibration signal (EQ signal shown in FIG. 3B) corresponding to a first group of sense amplifiers and a second group of sense amplifiers is disabled at $t_1$ as shown in FIG. 3B. As such, at $t_1$ the voltage on the complementary data lines 305-1 and 305-2 (e.g., D and D_) is $V_{DD}/2$.

A selected row to which the plurality of memory cells are coupled is enabled (e.g., selected, opened such as by activating a signal to select a particular row) as indicated by "Open Row" in the pseudo code and shown at $t_2$ in FIG. 3B. When the ROW signal reaches the threshold voltage (Vt) of the access transistors (e.g., 202-4) corresponding to the cells of the selected row, the access transistors turns on and a differential voltage signal is created between the complementary data line pairs (e.g., D/D_) based on the voltage stored on the capacitors (e.g., 203-4).

In the pseudo code above, "Fire Sense Amplifiers" indicates that the sense amplifiers are activated (e.g., fired) and subsequently deactivated as shown at $t_3$ and at $t_5$, respectively. Activating the sense amplifiers while the ROW that is coupled to the memory cells is enabled results in the data being moved via complementary data lines 305-1 and 305-2 from the memory cells to the sense amplifiers. The ACT positive control signal (e.g., 265 shown in FIG. 2C) going high while the RnIF negative control signal (e.g., 228 shown in FIG. 2C) goes low, which amplifies the differential signal between complementary data lines 305-1 and 305-2, resulting in data values being "latched" by the sense amplifiers.

In the pseudo code above, "Trigger EQ signal except where operation is desired" indicates that the equilibration signal (EQ signal shown in FIG. 3B) corresponding to the first group of sense amplifiers is enabled at $t_5$ as shown in FIG. 3B. Therefore, the complementary data lines 305-1 (D and D_) associated with the first group of sense amplifiers are shorted to $V_{DD}/2$ and complementary data lines 305-2 (D and D_) associated with the second group of sense amplifiers are not shorted to $V_{DD}/2$.

The complementary data lines 305-1 coupled to the first group of sense amplifiers are shorted to $V_{DD}/2$. The complementary data lines 305-2 coupled to the second group of sense amplifiers retain a $V_{DD}$ voltage or a GND voltage. In FIG. 3B, the EQ signal is shown as a solid line between $t_5$ and $t_7$ indicating the equilibration of the first group of sense amplifiers, while the EQ signal is shown as a dotted line between $t_5$ and $t_7$ indicating non-equilibration of the second group of sense amplifiers. In FIG. 3B, the activation signal applied to "SENSE AMP" is shown as a solid line between $t_5$ and $t_7$ indicating the deactivation of the first group of sense amplifiers due to the equilibration of the first group of sense amplifiers, while the activation signal applied to the "SENSE AMP" is shown as a solid line between $t_5$ and $t_7$ indicating the activation of the second group of sense amplifiers due to the non-equilibration of the second group of sense amplifiers. The data that was previously stored in the first group of sense amplifiers is lost upon the equilibration of the first group of sense amplifiers.

"Apply function lines" as shown in the above pseudocode can refer to activating appropriate control signals coupled to the sense amplifiers to perform a selected operation. As shown in FIG. 3B, at $t_6$ the function signal is activated indicating activation of appropriate control signals corresponding to a selected operation. Applying the function lines can also include transferring data between the sense amplifiers and the compute components. For example, data can be transferred from the first group of compute components to the first group of sense amplifiers due to the first group of sense amplifiers being in an equilibrated state. Transferring data from the first group of compute components to the first group of sense amplifiers can include not modifying the data stored in the first group of compute components. Data can be transferred from the second group of sense amplifiers to the second group of compute components due to the second group of the sense amplifiers being in an activated state. The data stored in the sense amplifiers can be selectively loaded into the compute components due to the data stored on the second group of sense amplifiers being moved to the second number of compute components without updating the data stored in the first group of compute components. S and S* are shown as fluctuating at $t_7$ to represent the loading of data into the second group of compute components and the retaining of data into the first group of compute components.

Once the function lines are deactivated, the data lines can be precharged as indicated by the "Equilibrate" in the pseudo code above and as shown at $t_7$ in FIG. 3B. A precharge of the data lines can be accomplished by an equilibrate operation, as described above.

FIG. 3C is a timing diagram illustrating operation of the sensing circuitry in accordance with a number of embodiments of the present disclosure. FIG. 3C provides an example of selectively copying data from memory cells coupled to a first access line to memory cells coupled to a second access line. Selectively copying data from a first plurality of memory cells coupled to the first access line to a second plurality of memory cells coupled to the second access line can include copying data stored in a first group of memory cells from the first plurality of memory cells to a first group of memory cells from the second plurality of memory cells and not copying data stored in a second group of memory cells from the first plurality of memory cells and to a second group of memory cells from the second plurality of memory cells.

In FIG. 3C, there are two groups of memory cells in each of the first plurality of memory cells coupled to the first row and the second plurality of memory cells coupled to the second row. However, examples are not limited to two groups of memory cells and can include more groups of memory cells in each of the first plurality of memory cells and the second plurality of memory cells. The first plurality of memory cells and the second plurality of memory cells are coupled to a plurality of sense lines. For example, a first memory cell in the first plurality of memory cells and a first memory cell in the second plurality of memory cells can be coupled to a first sense line, a second memory cell in the first plurality of memory cells and a second memory cell in the second plurality of memory cells can be coupled to a second sense line, . . . , an (N-1) memory cell in the first plurality of memory cells and an (N-1) memory cell in the second plurality of memory cells can be coupled to an (N-1) sense line. The sense lines that are coupled to the first plurality of memory cells and the second plurality of memory cells can be coupled to a plurality of sense amplifiers.

FIG. 3C illustrates a number of control signals associated with operating sensing circuitry (e.g., 250-2 in FIG. 2A). "EQ" corresponds to an equilibrate signal applied to the sense amplifier 206-2 (e.g., via an equilibrate control line), "ROW 1" corresponds to an activation signal applied to a first access line, "ROW 2" corresponds to an activation signal applied to a second access line, "SENSE AMP" corresponds to activation signal applied to a sense amplifier.

FIG. 3C also illustrates the waveform diagrams showing the signals (e.g., voltage signals) on a first group of data lines D and D_ (e.g., 305-1) coupled to a first group of sense amplifier from the plurality of sense amplifiers and on a second group of data lines D and D_ (e.g., 305-2) coupled to a second group of sense amplifiers from the plurality of sense amplifiers. The particular timing diagram waveforms are discussed below with respect to the pseudo code associated with selectively storing data in memory cells.

An example of pseudo code associated with selectively loading data in the compute components can be summarized as follows:
  Deactivate EQ;
  Open Row1;
  Fire Sense Amplifiers;
  Trigger EQ signal except where operation is desired;
  Open Row2;
  Fire Sense Amplifiers;
  Equilibrate;

In the pseudo code above, "Deactivate EQ" indicates that an equilibration signal (EQ signal shown in FIG. 3C) corresponding to a first group of sense amplifiers and a second group of sense amplifiers is disabled at $t_1$ as shown in FIG. 3C. As such, at $t_1$ the voltage on the complementary data lines 305-1 and 305-2 (e.g., D and D_) is $V_{DD}/2$.

A selected access line to which the first plurality of memory cells are coupled is enabled (e.g., by activating a "ROW1" signal provided to a select row) as indicated by "Open Row1" in the pseudo code and shown at $t_2$ in FIG. 3C. When the ROW signal reaches the threshold voltage (Vt) of the access transistors (e.g., 202-4) corresponding to the cells of the selected row, the access transistors turns on and a differential voltage signal is created between the complementary data line pairs (e.g., D/D_) based on the voltage stored on the capacitors (e.g., 203-4). The selected row is subsequently disabled as shown at $t_4$.

In the pseudo code above, "Fire Sense Amplifiers" indicates that the sense amplifiers are activated (e.g., fired) and subsequently deactivated as shown at $t_3$ and at $t_5$ in FIG. 3C. Activating the sense amplifiers while the selected row (e.g., ROW1) is enabled results in the data being moved via complementary data lines 305-1 and 305-2 from the first plurality of memory cells to the sense amplifiers. The ACT positive control signal (e.g., 265 shown in FIG. 2C) going high while the RnIF negative control signal (e.g., 228 shown in FIG. 2C) goes low, which amplifies the differential signal between complementary data lines 305-1 and 305-2, resulting in data values being "latched" by the sense amplifiers.

In the pseudo code above, "Trigger EQ signal except where operation is desired" indicates that the equilibration signal (EQ signal shown in FIG. 3C) corresponding to the first group of sense amplifiers is enabled at $t_5$ and subsequently disabled at $t_6$ as shown in FIG. 3C. Therefore, the complementary data lines 305-1 (D and D_) associated with the first group of sense amplifiers are shorted to $V_{DD}/2$ and complementary data lines 305-2 (D and D_) associated with the second group of sense amplifiers are not shorted to $V_{DD}/2$.

The complementary data lines 305-1 are coupled to the first group of memory cells from the first plurality of memory cells and the second plurality of memory cells. The complementary data lines 305-2 are coupled to the second group of memory cells from the first plurality of memory cells and the second plurality of memory cells. The complementary data lines 305-1 coupled to a first group of sense amplifiers are shorted to $V_{DD}/2$. The complementary data lines 305-2 coupled to a second group of sense amplifiers retain a $V_{DD}$ voltage or a GND voltage. In FIG. 3C, the EQ signal is shown as a solid line between $t_5$ and $t_6$ indicating the equilibration of the first group of sense amplifiers, while the EQ signal is shown as a dotted line between $t_5$ and $t_6$ indicating non-equilibration of the second group of sense amplifiers. The data that was previously stored in the first group of sense amplifiers is lost upon the equilibration of the first group of sense amplifiers.

A selected row (e.g., Row2) to which the second plurality of memory cells are coupled is enabled (e.g., selected, opened such as by activating a signal to select a particular row) as indicated by "Open Row2" in the pseudo code and shown at $t_7$ in FIG. 3C. When the ROW signal reaches the threshold voltage (Vt) of the access transistors (e.g., 202-4) corresponding to the cells of the selected row, the access transistors turns on a differential voltage signal is created between the complementary data lines pairs (e.g., D/D_) based on the voltage stored on the capacitors (e.g., 203-4). The selected row is subsequently disabled as shown at $t_9$.

In the pseudo code above, "Fire Sense Amplifiers" indicates that the sense amplifiers are activated (e.g., fired) and subsequently deactivated as shown at $t_8$ and at $t_{10}$, respectively. Activating the sense amplifiers while the ROW2 is enabled results in data being moved via complementary data lines 305-2 from the second plurality of sense amplifiers to the second group of memory cells from the second plurality of memory cells. The ACT positive control signal (e.g., 265 shown in FIG. 2C) going high while the RnIF negative control signal (e.g., 228 shown in FIG. 2C) goes low, which amplifies the differential signal between complementary data lines 305-2, resulting in data values being "latched" by the sense amplifiers. Data is not transferred from the first plurality of sense amplifiers to the first group of the second plurality of memory cells because the first plurality of sense amplifiers are in an equilibrated state before the sense amplifiers are activated.

As such, data is selectively copied from the first plurality of memory cells to the second plurality of memory cells. That is, data stored in the second group of the first plurality of memory cells is copied to the second group of the second plurality of memory cells while data stored in the first group of the first plurality of memory cells is not copied to the first group of the second plurality of memory cells.

Once the function lines are deactivated, the data lines can be precharged as indicated by the "Equilibrate" in the pseudo code above and as shown at $t_{10}$ in FIG. 3C. A precharge of the data lines can be accomplished by an equilibrate operation, as described above.

FIG. 3D is a timing diagram illustrating operation of the sensing circuitry in accordance with a number of embodiments of the present disclosure. FIG. 3D provides an example of selectively generating patterns of zeros and ones. The generated pattern can be stored in a plurality of compute components. The generated pattern can include blocks of 1-bits and 0-bits. In this example, a block of bits includes a plurality of bits stored in continuous compute components.

In FIG. 3D, a pattern includes two blocks of bits. However, examples are not limited to patterns including two blocks of bits and can include patterns including more than two blocks of bits. The first block of bits can be a block of 1-bits. The second block of bits can be a block of 0-bits. The first block of bits can be stored in a first group of compute components that are coupled to complementary data lines 305-1 and to a first group of sense amplifiers. The second block of bits can be stored in a second group of compute components that are coupled to complementary data lines 305-2 and to a second group of sense amplifiers.

FIG. 3D illustrates a number of control signals associated with operating sensing circuitry (e.g., 250-2 in FIG. 2A). "EQ" corresponds to an equilibrate signal applied to the sense amplifier 206-2 (e.g., via an equilibrated control line), "FUNCTION" corresponds to signals applied to PASS and/or PASS* gates that are controlled by a logical operation selection logic including the TF, TT, FT, and FF control signals, "ROW" corresponds to an activation signal applied to an access line, "SENSE AMP" corresponds to activation signal applied to a sense amplifier.

FIG. 3D also illustrates the waveform diagrams showing the signals (e.g., voltage signals) on a first group of data lines D and D_ (e.g., 305-1) coupled to a first group of sense amplifier and first group of compute components and on a second group of data lines D and D_ (e.g., 305-2) coupled to a second group of sense amplifiers and a second group of compute components. FIG. 3D also illustrates the waveform diagrams showing the signals (e.g., voltage signals) on the nodes S and S* corresponding to the compute components (e.g., accumulator) during the creation of the pattern. The particular timing diagram waveforms are discussed below with respect to the pseudo code associated with creating a pattern of 0-bits and 1-bits.

An example of pseudo code associated with selectively loading data in the compute components can be summarized as follows:
  Deactivate EQ;
  Clear Sense Amplifiers;
  Trigger EQ signal for blocks that should be set;
  Apply set/XNOR function signals;
  Copy from sense amplifiers to the accumulator;
  Equilibrate;

In the pseudo code above, "Deactivate EQ" indicates that an equilibration signal (EQ signal shown in FIG. 3D) corresponding to a first group of sense amplifiers and a second group of sense amplifiers is disabled at $t_1$ as shown in FIG. 3D. As such, at $t_1$ the voltage on the complementary data lines 305-1 and 305-2 (e.g., D and D_) is $V_{DD}/2$.

In the pseudo code above, "Clear Sense Amplifiers" indicates that the sense amplifiers can store 0-bits. The sense amplifiers can be cleared by activating the function lines as shown at $t_2$ in FIG. 3D and activating the sense amplifiers as shown at $t_3$ to create 0-bits and store the 0-bits in the sense amplifiers. The function lines and the sense amplifiers can be deactivated at $t_4$. A reset operation can be performed via the function lines to create a voltage (e.g., GND) corresponding to a logic 0 being on data line 305-1 (D) and data line 305-2 (D). The sense amplifiers can be activated to latch the 0-bits.

In the pseudo code above, "Trigger EQ signal for blocks that should be set" indicates that the equilibration signal (EQ signal shown in FIG. 3D) corresponding to the first group of sense amplifiers is enabled at $t_5$ and disabled at $t_6$ as shown in FIG. 3D. Therefore, the complementary data lines 305-1 (D and D_) associated with the first group of sense amplifiers are shorted to $V_{DD}/2$ and complementary data lines 305-2 (D and D_) associated with the second group of sense amplifiers are not shorted to $V_{DD}/2$.

The complementary data lines 305-1 coupled to the first group of sense amplifiers are shorted to $V_{DD}/2$. The complementary data lines 305-2 coupled to the second group of sense amplifiers retain a GND voltage. FIG. 3D shows the enablement of the equilibration signal (e.g., EQ) on a first group of sense amplifiers as a solid line at $t_5$. In FIG. 3D, the EQ signal is shown as a solid line between $t_5$ and $t_6$ indicating the equilibration of the first group of sense amplifiers, while the EQ signal is shown as a dotted line between $t_5$ and $t_6$ indicating non-equilibration of the second group of sense amplifiers. The data that was previously stored in the first group of sense amplifiers is lost upon the equilibration of the first group of sense amplifiers.

In the pseudo code above, "Apply set/XNOR function signals" indicates that the function lines can be activated to select a set/XNOR operation as shown at $t_7$ in FIG. 3D. The function lines can be subsequently be deactivated as shown at $t_9$. Applying the function lines to select a set/XNOR operation can include applying the function lines to perform a set operation, storing the results in the sense amplifiers, performing an XNOR operation, and storing the results in the compute components concurrently. As such, the function lines can be activated to create a voltage (e.g., $V_{DD}$) corresponding to a logic 1 being on data line 305-1 (D) and a voltage (e.g., GND) corresponding to a logic 0 being on data line 305-2 (D). The sense amplifiers can be activated as shown at $t_8$ in FIG. 3D to store the 1-bits in first group of sense amplifiers coupled to the complementary data lines 305-1 and to store the 0-bits in the second group of sense amplifiers coupled to the complementary data lines 305-2.

In the pseudo code above, "Copy from sense amplifiers to the accumulator" indicates that the function lines can be activated while the sense lines are active as shown at $t_{10}$ in FIG. 3D. The function lines can be activated to select a copy operation and to transfer data from the sense amplifiers to the compute components. S and S* are shown as fluctuating at $t_{10}$ to represent the storing of data into the compute components. As such, the compute components can store 1-bits in a first block of compute components and 0-bits in a second block of compute components.

Once the function lines and the sense amplifiers are deactivated as shown at $t_{11}$, the data lines can be precharged as indicated by the "Equilibrate" in the pseudo code above and as shown at $t_{12}$ in FIG. 3D. A precharge of the data lines can be accomplished by an equilibrate operation, as described above.

FIG. 3E is a timing diagram illustrating operation of the sensing circuitry in accordance with a number of embodiments of the present disclosure. FIG. 3E provides an example of selectively loading data into the compute components and storing the data in to the memory cells concurrently. That is, FIG. 3E provides an example of selectively loading data previously stored in the memory cells into a plurality of compute components and storing the selectively loaded data into the memory cells. Selectively modifying the plurality of compute components includes modifying data stored in a first group of compute components and retaining (e.g., not modifying) data stored in a second group of compute components.

In FIG. 3E, there are two groups of compute components. However, examples are not limited to two groups of compute components and can include more groups of compute components. A first group of compute components is modified and a second group of compute components is not modified. The first group of compute components is coupled to a first plurality of sense lines. The first plurality of sense lines are coupled to a first group of sense amplifiers and associated memory cells. The second group of compute components is coupled to a second plurality of sense lines. The second plurality of sense lines is coupled to a second group of sense amplifiers and associated memory cells.

FIG. 3E illustrates a number of control signals associated with operating sensing circuitry (e.g., 250-2 in FIG. 2A). "EQ" corresponds to an equilibrate signal applied to the sense amplifier 206-2 (e.g., via an equilibrate control line), "FUNCTION" corresponds to signals applied to a PASS and/or PASS* gates that are controlled by a logical operation selection logic including the TF, TT, FT, and FF control signals, "ROW" corresponds to an activation signal applied to an access line, "SENSE AMP" corresponds to activation signal applied to a sense amplifier.

FIG. 3E also illustrates the waveform diagrams showing the signals (e.g., voltage signals) on a first group of data lines D and D_ (e.g., 305-1) coupled to a first group of sense amplifier and on a second group of data lines D and D_ (e.g., 305-2) coupled to a second group of sense amplifiers. FIG. 3E also illustrates the waveform diagrams showing the signals (e.g., voltage signals) on the nodes S and S* corresponding to the compute component (e.g., accumulator) during the selective store operation. The particular timing diagram waveforms are discussed below with respect to the pseudo code associated with selectively storing data in memory cells.

An example of pseudo code associated with selectively loading (e.g., storing) data in the compute components can be summarized as follows:
  Deactivate EQ;
  Open Row;
  Fire Sense Amplifiers except where a store is desired;
  Apply Function Lines;
  Fire remaining Sense Amplifiers;
  Close Row;
  Equilibrate;

In the pseudo code above, "Deactivate EQ" indicates that an equilibration signal (EQ signal shown in FIG. 3E) corresponding to a first group of sense amplifiers and a second group of sense amplifiers is disabled at $t_1$ as shown in FIG. 3E. As such, at $t_1$ the voltage on the complementary data lines 305-1 and 305-2 (e.g., D and D_) is $V_{DD}/2$.

A selected access line to which the plurality of memory cells are coupled is enabled (e.g., by activating a "ROW" signal provided to select row) as indicated by "Open Row" in the pseudo code and shown at $t_2$ in FIG. 3E. When the ROW signal reaches the threshold voltage (Vt) of the access transistors (e.g., 202-4) corresponding to cells of the selected row, the access transistors turns on and a differential voltage signal is created between the complementary data line pairs (e.g., D/D_) based on the voltage stored on the capacitors (e.g., 203-4).

In the pseudo code above, "Fire Sense Amplifiers except where a store is desired" indicates that the first group of sense amplifiers are activated (e.g., fired) as shown at $t_3$. Activating the sense amplifiers while the selected row (e.g., ROW) is enabled results in the data being moved via complementary data lines 305-1 from the first group of memory cells to the first group of sense amplifiers. The ACT positive control signal (e.g., 265 shown in FIG. 2C) going high while the RnIF negative control signal (e.g., 228 shown in FIG. 2C) goes low, which amplifies the differential signal between complementary data lines 305-1, resulting in data values being "latched" by the sense amplifiers. The second group of sense amplifiers continues in an equilibrated state.

The function lines coupled to the sense amplifiers can be activated and deactivated (e.g., selected, opened such as by activating a signal to select a particular function line) as indicated by "Apply Function lines" in the pseudo code and shown at $t_4$ and $t_6$ for FUNCTION in FIG. 3E. Applying the function lines can include transferring data between the sense amplifiers and the compute components. For example, data can be transferred from the second group of compute components to the second group of sense amplifiers due to the second group of sense amplifiers being in an equilibrated state. Transferring data from the second group of compute components to the second group of sense amplifiers can include not modifying the data stored in the second group of compute components. Data can be transferred from the first group of sense amplifiers to the first group of sense amplifiers due to the first group of the sense amplifiers being in an activated state. The data stored in the sense amplifiers can be selectively loaded into the compute components due to the data stored in the second group of sense amplifiers being moved to the second number of compute components without updating the data stored in the first group of compute components. S and S* are shown as fluctuating at $t_4$ to represent the loading of data into the second group of compute components and not loading of data into the first group of compute components.

After the function lines are activated, in the pseudo code above, "Fire remaining Sense Amplifiers" indicates that the first group of sense amplifiers are activated (e.g., fired) as shown at $t_5$. Activating the sense amplifiers that were not activated at $t_3$ as the selected row (e.g., ROW) is enabled and the function lines are enabled results in data being moved via complementary data lines 305-1 from first group of sense amplifiers to the first group of compute components and from the first group of sense amplifiers to the first group of memory cells. The data that is moved from the first group of sense amplifiers to the first group of compute components at $t_5$ is the same data that was moved from the first group of compute components to the first group of sense amplifiers at $t_4$. As such, moving data from the first group of sense amplifiers to the first group of compute components includes the first group of compute components retaining the data stored in the first group of compute components because the data in the first group of compute components does not change. The function lines can be disabled at $t_6$. The ROW can be disabled at $t_7$. The sense amplifiers can be deactivated at $t_5$.

The data lines can be precharged as indicated by the "Equilibrate" in the pseudo code above and as shown at $t_5$ in FIG. 3E. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. One potential advantage of the apparatuses and methods described herein is not realized in terms of single instruction speed, but rather the cumulative speed that can be achieved by an entire bank of data being computed in parallel without necessarily transferring data out of the memory array (e.g., DRAM) or firing a column decode. For example, data transfer time can be reduced and/or eliminated. Also, a number of apparatuses of the present disclosure can perform ANDS or ORs in parallel, e.g., concurrently, using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving an off pitch processing unit discrete from the memory such that data must be transferred there between. An apparatus and/or methods according to the present disclosure can also use less energy/area than configurations where the logical operation is discrete from the memory. Furthermore, an apparatus and/or methods of the present disclosure can provide additional energy/area advantages since the in-memory-array logical operations eliminate certain data value transfers.

What is claimed is:

1. An apparatus, comprising:
an array of memory cells; and
a plurality of sensing components coupled to the array and comprising:
a first group of sensing components coupled to a controller via a first number of control lines; and
a second group of sensing components coupled to the controller via a second number of control lines;
wherein the controller is configured to activate at least one of the first number of control lines and the second number of control lines;
wherein each of the plurality of sensing components comprises a respective sense amplifier, a respective compute component coupled to the respective sense amplifier, and respective logical operation selection logic coupled to the respective compute component and to the respective sense amplifier; and
wherein each of the plurality of sensing components is configured to transfer data from its respective compute component to its respective sense amplifier, in response to its respective logical operation selection logic being activated while its respective sense amplifier is equilibrated, and to transfer data from its respective sense amplifier to its respective compute component, in response to its respective logical operation selection logic being activated while its respective sense amplifier is not equilibrated.

2. The apparatus of claim 1, wherein the first number of control lines are independent from the second number of control lines.

3. The apparatus of claim 1, wherein the controller is configured to activate the first number of control lines to equilibrate the sense amplifiers of the first group of sensing components and to activate the second number of control lines to equilibrate the sense amplifiers of the second group of sensing components.

4. The apparatus of claim 3, wherein the controller is further configured to activate the first number of control lines to equilibrate the sense amplifiers of the first group of sensing components without equilibrating the sense amplifiers of the second group of sensing components.

5. The apparatus of claim 1, wherein the controller is further configured to activate the respective logical operation selection logic of each of the plurality of sensing components based on a data value stored in the respective sense amplifier and a data value stored in the respective compute component.

6. The apparatus of claim 1, wherein the controller is further configured to activate the respective logical operation selection logic of each of the plurality of sensing components independent of a data value on a pair of complimentary data lines coupled to the respective sense amplifier.

7. An apparatus, comprising:
an array of memory cells; and
a plurality of sensing components corresponding to a respective plurality of columns of the array, the plurality of sensing components configured to receive a control signal from a controller;
wherein the controller is configured to selectively provide the control signal to the plurality of sensing components;
wherein each one of the plurality of sensing components is configured to receive a number of control signals and
wherein the plurality of sensing components comprise:
a first group of sensing components coupled to a controller via a first number of control lines; and
a second group of sensing components coupled to the controller via a second number of control lines;
wherein the controller is configured to selectively activate at least one of the first number of control lines and the second number of control lines;

wherein each sensing component comprises a sense amplifier coupled to a compute component; and wherein a compute component of a sensing component is configured to send data to a compute component of an adjacent sensing component.

8. The apparatus of claim 7, wherein the number of control signals include at least one of an activation signal and an equilibration signal.

9. The apparatus of claim 7, wherein each sensing component from the first group of sensing components is physically next to a sensing component from the second group of sensing components.

10. The apparatus of claim 7, wherein the first group of sensing components is physically separate from the second group of sensing components.

11. A method, comprising:
equilibrating a first group of sensing components of a plurality of sensing components corresponding to a plurality of columns of memory cells of an array;
transferring data from first compute components of the first group to first sense amplifiers of the first group in response to activating logical operation selection logic of the first group while the first group is equilibrated;
maintaining a second group of sensing components of the plurality of sensing components in a non-equilibrated state while performing an operation on data stored in the second group of sensing components; and
transferring data from second sense amplifiers of the second group to second compute components of the second group in response to activating logical operation selection logic of the second group while the second group is in the non-equilibrated state.

12. The method of claim 11, including performing the operation without transferring data from the array via an input/output (I/O) line.

13. The method of claim 11, wherein equilibrating the first group removes data previously stored in the first sense amplifiers from the first sense amplifiers.

14. The method of claim 11, further comprising selecting the operation by activating the logical operation selection logic in the plurality of sensing components.

15. A method, comprising:
equilibrating a first group of a plurality of sensing components;
activating an access line after the first group of the plurality of sensing components is equilibrated and while a second group of the plurality of sensing components is not equilibrated;
activating the plurality of sensing components while the access line is activated;
moving data from first memory cells coupled to the access line to the first group of the plurality of sensing components in response to activating the plurality of sensing components while the access line is activated; and
moving data from the second group of the plurality of sensing components to second memory cells coupled to the access line in response to activating the plurality of sensing components while the access line is activated.

16. The method of claim 15, wherein equilibrating the first group of the plurality of sensing components comprises equilibrating first sense amplifiers of the first group of the plurality of sensing components, and wherein the second group of the plurality of sensing components that is not equilibrated comprises second sense amplifiers that are not equilibrated.

17. The method of claim 15,
wherein the each of the plurality of sensing components comprises a respective sense amplifier coupled to a respective compute component, wherein the method further comprises:
transferring data from the respective compute component in each of the plurality of sensing components to the respective sense amplifier in each of the plurality of sensing components before equilibrating the first group of the plurality of sensing components.

18. The method of claim 15, further comprising deactivating the access line subsequent to activating the plurality of sensing components.

19. The method of claim 15, further comprising equilibrating the plurality of sensing components subsequent to performing the operation.

20. The method of claim 15, further comprising removing data previously stored in the first group of the plurality of sensing components in response to equilibrating the first group.

21. A method, comprising:
equilibrating a first group of a plurality of sense amplifiers of a corresponding plurality of sensing components;
activating logical operation selection logic in the plurality of sensing components after the first group is equilibrated and while a second group of the plurality of sense amplifiers is not equilibrated;
transferring data from a plurality of compute components coupled to the first group to the first group in response to activating the logical operation selection logic; and
transferring data from the second group to a plurality of compute components coupled to the second group while the logical operation selection logic is activated.

22. The method of claim 21, further comprising:
activating an access line; and
activating the plurality of sense amplifiers to move data from memory cells coupled to the access line to the plurality of sense amplifiers.

23. The method of claim 22, wherein equilibrating the first group removes the data moved to the first group.

24. The method of claim 21, further comprising deactivating the logical operation selection logic and equilibrating the plurality of sense amplifiers subsequent to deactivating the logical operation selection logic.

25. The method of claim 21, wherein transferring the data from the plurality of compute components coupled to the first group to the first group comprises transferring the data to the first group without modifying the data in the plurality of compute components.

26. An apparatus comprising:
a plurality of sensing components corresponding to a respective plurality of columns of an array of memory cells, each sensing component comprising a sense amplifier and a corresponding compute component; and a controller configured to:
activate a first logical operation and the sense amplifiers of the plurality of sensing components to store a first data pattern in the sense amplifiers while the sense amplifiers are not equilibrated;
equilibrate a first number of groups of the plurality of sense amplifiers to remove the first data pattern from the first number of groups while a second number of groups of the plurality of sense amplifiers that are not equilibrated store the first data pattern;
activate a second logical operation in each of the plurality of sensing components to store a second data pattern in the first number of groups; and store, in corresponding compute components, the first data pattern stored in the first number of groups and the second data pattern stored in the second number of groups.

27. The apparatus of claim 26, wherein the controller is further configured to activate the second logical operation to perform an exclusive NOR (XNOR) operation.

28. The apparatus of claim 27, wherein the controller is further configured to, subsequent to storing the data values in the corresponding compute components, store a same particular data value in each of the plurality of sense amplifiers.

29. A method, comprising:
activating a first access line coupled to a plurality of first memory cells storing data, wherein the plurality of first memory cells is coupled to a plurality of sensing components comprising a plurality of sense amplifiers and a plurality compute components;
activating the plurality of sense amplifiers while the first access line is activated to move the data from the plurality first memory cells to the plurality of sense amplifiers;
equilibrating a first group of the plurality of sense amplifiers without equilibrating a second group of the plurality of sense amplifiers, wherein equilibrating the first group removes the data from first group while the data remains in the second group;
activating a second access line coupled to a plurality of second memory cells, wherein the plurality of second memory cells is coupled to the plurality of sensing components; and
activating the second group while the second access line is activated to move the data from the second group to the plurality of second memory cells.

* * * * *